United States Patent
Paulauskas et al.

(10) Patent No.: US 9,447,205 B2
(45) Date of Patent: Sep. 20, 2016

(54) ATMOSPHERIC PRESSURE PLASMA PROCESSING OF POLYMERIC MATERIALS UTILIZING CLOSE PROXIMITY INDIRECT EXPOSURE

(71) Applicant: UT-Battelle, LLC, Oak Ridge, TN (US)

(72) Inventors: Felix L. Paulauskas, Knoxville, TN (US); Truman Bonds, Knoxville, TN (US)

(73) Assignees: UT-BATTELLE, LLC, Oak Ridge, TN (US); REMAXCO TECHNOLOGIES, Knoxville, TN (US)

( * ) Notice: Subject to any disclaimer, the term of this patent is extended or adjusted under 35 U.S.C. 154(b) by 552 days.

(21) Appl. No.: 13/680,406

(22) Filed: Nov. 19, 2012

(65) Prior Publication Data

US 2014/0142255 A1    May 22, 2014

(51) Int. Cl.

| C08F 8/06 | (2006.01) |
|---|---|
| B01J 19/08 | (2006.01) |
| H01J 37/32 | (2006.01) |
| H05H 1/24 | (2006.01) |
| D01F 9/32 | (2006.01) |
| D06B 19/00 | (2006.01) |

(52) U.S. Cl.
CPC ............... *C08F 8/06* (2013.01); *B01J 19/087* (2013.01); *D01F 9/328* (2013.01); *D06B 19/00* (2013.01); *H01J 37/3277* (2013.01); *H01J 37/32348* (2013.01); *H01J 37/32522* (2013.01); *H05H 1/2406* (2013.01); *H05H 2001/2412* (2013.01); *H05H 2001/2437* (2013.01)

(58) Field of Classification Search
CPC ....... C08F 8/06; D01F 9/328; H05H 1/2406; H05H 2001/2412; H05H 2001/2437; H01J 37/32348; H01J 37/32522; H01J 37/3277; H01J 19/087

See application file for complete search history.

(56) References Cited

U.S. PATENT DOCUMENTS

| 7,534,854 B1 | 5/2009 | Paulauskas et al. |
|---|---|---|
| 7,649,078 B1 | 1/2010 | Paulauskas et al. |
| 8,227,051 B1 | 7/2012 | Paulauskas et al. |

FOREIGN PATENT DOCUMENTS

| EP | 1 507 281 A1 | 2/2005 |
|---|---|---|
| EP | 2 205 049 A1 | 7/2010 |
| KR | 20110034728 A | * 4/2011 |
| WO | WO 2009/005895 A2 | 1/2009 |

OTHER PUBLICATIONS

English machine translation of KR20110034728A.*

(Continued)

*Primary Examiner* — Richard M Rump
(74) *Attorney, Agent, or Firm* — Scully Scott Murphy & Presser

(57) ABSTRACT

A plasma treatment method that includes providing treatment chamber including an intermediate heating volume and an interior treatment volume. The interior treatment volume contains an electrode assembly for generating a plasma and the intermediate heating volume heats the interior treatment volume. A work piece is traversed through the treatment chamber. A process gas is introduced to the interior treatment volume of the treatment chamber. A plasma is formed with the electrode assembly from the process gas, wherein a reactive species of the plasma is accelerated towards the fiber tow by flow vortices produced in the interior treatment volume by the electrode assembly.

18 Claims, 9 Drawing Sheets

(56) References Cited

OTHER PUBLICATIONS

Liu, Yan Chun, and Da Nian Lu. "Surface energy and wettability of plasma-treated polyacrylonitrile fibers." Plasma chemistry and plasma processing 26.2 (2006): 119-126.*

Wu, G. M. "Oxygen plasma treatment of high performance fibers for composites." Materials Chemistry and Physics 85.1 (2004): 81-87.*

International Search Report and Written Opinion dated Feb. 5, 2014 received from related International Application No. PCT/US2013/070643.

* cited by examiner

ATMOSPHERIC PRESSURE PLASMA PROCESSING OF POLYMERIC MATERIALS UTILIZING CLOSE PROXIMITY INDIRECT EXPOSURE

REGARDING FEDERALLY SPONSORED RESEARCH OR DEVELOPMENT STATEMENT

This invention was made with government support under Contract Number DE-AC05-00OR22725 between the United States Department of Energy and UT-Battelle, LLC. The U.S. government has certain rights in this invention.

FIELD OF THE INVENTION

The present disclosure relates to apparatus and methods for stabilization and oxidation of polymeric materials, and more particularly to apparatus and methods for plasma based stabilization and oxidation of polymeric materials.

BACKGROUND

The production of carbon fibers from thermoplastic-based fibers, e.g., polyacrylonitrile (PAN), is typically a multi-step process in which polyacrylonitrile (PAN) fibers are first treated in an oxidizing atmosphere at temperatures ranging from ambient up to about 300° C., while the fibers are maintained under tension inside of large furnaces. The oxidized fibers are subsequently carbonized at temperatures starting at about 500° C. and continuing up to about 1000° C.-1200° C. in an inert atmosphere (carbonization step) and then optionally further heated up to about 3000° C. Traditionally, the first oxidation or stabilization processing step is the most time-consuming and rate-limiting step in conventional carbon fiber manufacturing.

SUMMARY

In one embodiment of the present disclosure, a plasma treatment apparatus is provided that comprises a chamber including an interior treatment volume and a heating source. A process gas inlet extends into the interior treatment volume. A work piece is drawn through the interior treatment volume, wherein the work piece enters the interior treatment volume at a first end of the chamber and exits the interior treatment volume at a second end of the chamber. An electrode assembly is present in the interior treatment volume in close proximity to the work piece. The electrode assembly includes a dielectric barrier and at least two plasma-generating electrodes present on a surface of a dielectric barrier that are separated from one another.

In another aspect of the present disclosure, a plasma treatment apparatus is provided that includes a chamber having an outer shell, an interior treatment volume and an intermediate heating volume, wherein the interior treatment volume is separated from the intermediate heating volume by an inner shell. At least one process gas inlet introduces at least one reactive species producing gas to the interior treatment volume of the chamber. The at least one process gas inlet extends from the outer shell through the interior treatment volume and the interior shell into the interior treatment volume. A work piece extends through the interior treatment volume. The plasma treatment apparatus also includes an electrode assembly that is present in the interior treatment volume of the chamber so that the work piece passes the electrode assembly as traveling from a first end of the chamber to the second end of the chamber. The electrode assembly generates a plasma from the at least one process gas and induces flow vortices to accelerate a reactive species from the plasma to the work piece.

In another aspect, a plasma treatment method is provided. In one embodiment, the plasma treatment includes providing a chamber including an intermediate heating volume and an interior treatment volume. The interior treatment volume contains an electrode assembly for generating a plasma. The intermediate heating volume heats the interior treatment volume. A work piece is traversed through the interior treatment volume. A process gas is introduced to the interior treatment volume. A plasma is formed with an electrode assembly from the process gas. The reactive species of the plasma is accelerated towards the work piece by flow vortices produced by the electrode assembly.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
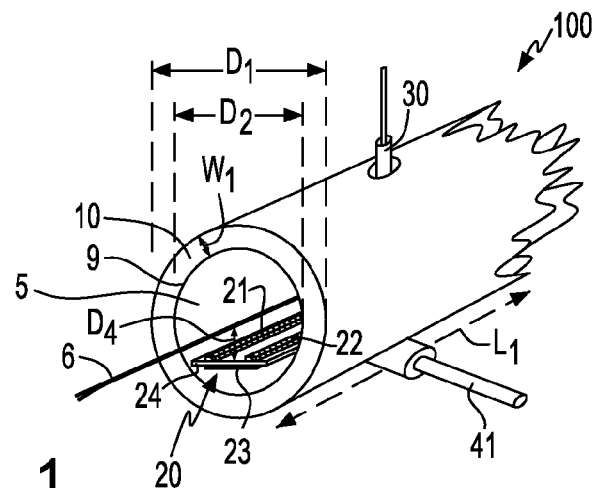
FIG. 1 is an isometric view of a treatment chamber of a plasma treatment apparatus for applying a close proximity indirect exposure (CPIE) plasma treatment process to a work piece, in accordance with one embodiment of the present disclosure.

Detailed embodiments of the present disclosure are described herein; however, it is to be understood that the disclosed embodiments are merely illustrative of the compositions, structures and methods of the disclosure that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the compositions, structures and methods disclosed herein. References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment.

As used herein, the term "plasma" denotes a state of matter similar to gas in which a certain portion of the particles are ionized. The plasma state is commonly referred to as the fourth state of matter. From a purely thermal standpoint, heating a gas sufficiently will cause a phase change to the plasma state, just as heating a solid would cause it to melt, or heating a liquid would cause it to evaporate. As such, sufficiently heating a gas will ionize its molecules or atoms (reduce or increase the number of electrons in them), thus inducing a phase change to a plasma, which contains charged particles: positive ions and negative electrons or ions. A plasma can be fully ionized, or partially ionized. Ionization can be induced by non-thermal mechanisms, such as strong electromagnetic fields, and can be accompanied by the dissociation of molecular bonds, if present. Plasma-based industrial processing techniques may include either "remote exposure" or "direct exposure". The direct exposure method involves immersing the work piece directly into the plasma volume. With respect to polyacrylonitrile (PAN) fiber, the direct exposure plasma method typically inflicts too much damage to the material while not inducing significant enough oxidation. The remote exposure (RE) plasma method instead utilizes only the reactive species generated by the plasma, and not the plasma volume itself. Typically, a length of tubing typically made of, but not limited to, fluoropolymer (for chemical purity) is used to connect the plasma volume to the treatment volume. An investigation into the effect of the length of separation of the treatment area from the plasma volume showed little impact on remote exposure (RE) plasma process. This was due to the fact that there is a significant half-life threshold that separates reactive species that have half-lives on the order of minutes versus reactive species with half-lives on the order of milliseconds or less. Similar to direct exposure plasma methods, remote exposure plasma methods can also damage the polymeric work piece being treated. The moderate damage being inflicted on the polymeric work piece in both direct exposure and remote exposure limit the resulting carbonized mechanical properties of the resultant carbon fiber.

In one embodiment, the methods and structures disclosed herein can overcome the above mentioned difficulties in treating polymeric precursors with plasma based processes, such as oxidation via direct exposure and indirect exposure plasmas, with a method and apparatus that combines the integration of a heated treatment chamber and a plasma discharge chamber, a fiber deliver technique for drawing polymeric fiber through the treatment chamber, and a plasma generation method that accelerates plasma generated reactive species to the polymeric fiber.

FIG. 1 depicts one embodiment of the treatment chamber 100 of a plasma treatment apparatus that provides a close proximity indirect exposure (CPIE) plasma treatment process that may include the integration of a heated treatment chamber, i.e., an intermediate heating volume 10, and a plasma discharge chamber, i.e., interior treatment volume 5. One difficulty with the typical remote exposure (RE) plasma method is the lack of thermal uniformity and efficiency within the treatment chamber. In some embodiments, the treatment chamber 100 depicted in FIG. 1 provides for increased thermal uniformity and efficiency when compared to remote exposure (RE) plasma methods. In some embodiments, to more uniformly distribute heat throughout the treatment chamber 100, an intermediate heating volume 10 provides convective heating which is distributed by flow vortices in the treatment volume 5 that result from an asymmetrical electric field gradient produced by an electrode assembly 20 that is present in the interior treatment volume 5.

More specifically, the treatment chamber 100 depicted in FIG. 1 utilizes convective heating control, where an inner shell 9 and outer shell 11 defines a intermediate heating volume 10 that becomes the heating source of the interior treatment volume 5, i.e., the plasma discharge chamber. This interior treatment volume 5 is isolated from the furnace portion, i.e., intermediate heating volume 10, of the treatment chamber 100 by a material that provides the inner shell 9. Thermal energy is diffused from the intermediate heating volume 10 to the interior treatment volume 5. In the interior treatment volume 5, the fibers of polymeric precursor are drawn through lengthwise as a work piece 6 in the form of a fiber tow.

Referring to FIG. 1, a wide variety of enclosure shapes are suitable for the treatment chamber 100, whether cylindrical, rectangular, ellipsoidal, square, or other general enclosing cross sections. In some embodiments, anything that can be viewed as a thermal enclosure could be implemented as the treatment chamber 100. Further, FIG. 1 only depicts one form of a treatment chamber 100. For example, in another possible configuration multi-pass zones may be employed within one single cylindrical cross section.

Referring to FIG. 1, in one embodiment, the outer shell 11 of the treatment chamber 100 has a cylindrical geometry. It is noted that the cylindrical geometry for the outer shell 11 of the treatment chamber 100 is provided for illustrative purposes only, and is not intended to limit the present disclosure to only that geometry, as the outer shell 11 of the treatment chamber 100 may have any geometry. For example, the outer shell 11 may have a multi-sided geometry, such as having a rectangular geometry. The outer shell 11 may be composed of a metal, such as stainless steel. In one embodiment, the outer shell 11 of the treatment chamber 100 may be composed of thermally insulative materials that can be exposed to temperatures greater than 300° C., such as polymers and ceramics. In another embodiment, the outer shell 11 of the treatment chamber 100 may be composed of a metal and may have an insulating blanket present about the exterior surface of the outer shell 11. The insulating blanket may be composed of a fiberglass based insulation, ceramic based insulation, or may be polymeric. In one embodiment, in which the outer shell 11 has a cylindrical geometry, the outer shell 11 may have a length L1 ranging from 2 cm to 5000 cm, and may have a diameter D1 ranging from 2 cm to 500 cm.

The inner shell 9 of the treatment chamber 10 defines the volume of the intermediate heating volume 10 and the interior treatment volume 5. In the embodiment depicted in FIG. 1, the inner shell 9 has a cylindrical geometry that corresponds to the cylindrical geometry of the outer shell 11. Similar to the outer shell 11, the geometry of the inner shell 9 is not limited to being a cylinder. For example, the inner shell 9 may also be multi-sided, such as being rectangular in geometry. In some embodiments, the inner shell 9 is composed of an electrically insulating material, wherein the material of the inner shell 9 allows for thermal energy to be diffused from the intermediate heating volume 10 to the interior treatment volume 5 in order to heat the interior treatment volume 5. It is not necessary that the inner shell 9 be composed of an electrically insulating material, as the inner shell 9 may be composed of a metal. Another function of the inner shell 9 is to enclose the process gases and process exhausts, which can be corrosive and explosive in nature, and to prevent their leakage to the outside environment. Proper exhausting ensures safe operation.

In some embodiments, the material of the inner shell 9 may be composed of glass, ceramics, mica, metals, any high temperature composites (metal, polymer, ceramic and a combination thereof. The dimensions of the inner shell 9 are selected so that the inner shell 9 is contained within the outer shell 11, and so that the space separating the inner shell 9 and the outer shell 11 is sufficient to provide the intermediate heating volume 10. In one embodiment, the dimensions of the inner shell 9 are selected so that the dimension W1 separating the inner shell 9 and the outer shell 11 may range from 0.1 cm to 100 cm. In another embodiment, the dimension W1 separating the inner shell 9 and the outer shell 11 may range from 1 cm to 10 cm.

In some embodiments, the intermediate heating volume 10 increases the temperature of the interior treatment volume 5 by convective heat, i.e., the intermediate heating volume is a component of a convection heater. A "convection heater" is a heater that operates by air convection currents circulating across a heating element, such as an air process heater, and then to the work product to be heated. In one embodiment, the heating element that produces the heat for the intermediate heating volume 10 is a resistance heater, i.e., electrical heater element. In one embodiment, the heating element is not present in the intermediate heating volume 10, but is present to the exterior of the intermediate heating volume 10, wherein the heat produced by the heating element is transported to the intermediate heating volume by air. The heat then diffuses through the inner shell 9 into the interior treatment volume 5. Therefore, in some examples, the electrical input from the electrical heater element heats the process air, and in turn, the process air heats the interior treatment volume 5 by filling the intermediate heating volume 10 and heating the wall of the interior treatment volume 5, i.e., heating the inner shell 9, which heats the interior treatment volume 5. The heating element may be a resistance wire or ribbon composed of kathal (FeCrAl), nichrome 80/20, copper nickel alloys, molybdenum disilicide ($MoSi_2$) and molybdenum disilicide doped with aluminum (Al). The heating element may also be composed of positive thermal coefficient of resistance (PTCR) ceramics, such as barium titanate and lead titanate composites. The heating element may also be provided by heat lamps, conductive heating, microwave heating, resistive heating, and a combination thereof. The air for transporting the heat produced by the heating element to the intermediate heating volume is delivered through the injection port 41 and may be provided by a compressed gas source, fans, blowers, or by a ducting providing a chimney effect.

The methods and structure disclosed herein is not limited to convective heating methods for heating the intermediate heating volume 10. For example, the intermediate heating volume 10 may be heated using at least one of conductive heating, infrared heating, inductive heating, and microwave heating. In some embodiments, to provide for conductive heating of the interior treatment volume 5, contact heaters can be attached to the wall, i.e., inner shell 9, of the interior treatment volume 5, and impart heat directly onto the wall of the interior treatment volume 5, i.e., inner shell 9. Such contact heaters could typically have internal electrically resistive elements that impart heat directly to the wall of the interior treatment volume 5 through an intermediate substrate of the contact heater itself. The heater can be bonded to the wall by a high temperature, thermally conductive adhesive, cement or epoxy.

In some embodiments, to provide for infrared heating of the interior treatment volume 5, infrared heaters are installed in such a way that they radiate heat to a coating on the wall of the interior treatment volume 5, i.e., inner shell 9, that is strongly absorbing in the infrared region and thus heats and transfers thermal energy to the interior treatment volume 5. In another embodiment, to provide for infrared heating of the interior treatment volume 5, the wall of the interior treatment volume 5 is heated by itself, i.e., inner shell 9, given that the wall is constructed of a material that could efficient absorb and be heated by infrared energy. Infrared heaters can be positioned outside the treatment volume and transmit IR energy directly to the work piece 6 when the interior treatment volume wall is built to be transparent to IR energy. The infrared heaters can be installed inside the intermediate heating volume 10 or may be mounted in the interior treatment volume 5 in such a way as they are sufficiently isolated electrically and chemically isolated from the plasma electrodes so that the infrared energy would be directly transmitted to the work piece 6. A typical example of an infrared heater is an electrically resistive element that when current passes through, efficiently converts that energy to infrared radiation, or when current passes through, heats a substrate that efficiently converts thermal energy to infrared radiation.

In some embodiments, microwave energy can be utilized to heat a work piece 6 or chamber wall, i.e., inner shell 9. In some examples, for microwave energy to be efficiently useful either the work piece 6 or chamber wall, i.e., inner shell 9, be able to absorb the majority of the microwave energy and efficiently convert it to thermal energy. Therefore, two possible configurations exist that are similarly described as in the infrared configurations. The most common microwave energy source is the magnetron. Coupling the source with waveguides could achieve the desired heating effect.

In one embodiment, the heat produced in the intermediate heating volume 10 may increase the temperature of the interior treatment volume 5 by a temperature ranging from room temperature, e.g., 20° to 25° C., to 500° C. In another embodiment, the heat produced in the intermediate heating volume 10 may increase the temperature of the interior treatment volume 5 by a temperature ranging from 100° C., to 300° C.

The treatment chamber 100 may include openings at each end of the treatment chamber 100 to allow for the work piece 6 to be drawn through the treatment chamber 100 by the work piece 6. The openings at each end of the treatment chamber 100 may be sized and may be in any number that will allow for the selected number of work pieces 6 to be drawn through the treatment chamber 100. The treatment chamber 100 may also include openings through which the process gas inlet 30 extends into the interior treatment volume 5. Although, the process gas inlet 30 is depicted as being positioned through an upper surface of the treatment chamber 100 above the work piece 6 and the electrode assembly 20, the position of the process gas inlet 30 is not limited to only this arrangement. The process gas inlet 30 provides for process gases to be introduced to the interior treatment volume 5 of the treatment chamber 100 that also contains the electrode assemblies 20.

In one embodiment, the methods and structures disclosed herein provide for oxidation or chemical cross-linking of polyacrylonitrile (PAN) fibers or other polymeric materials. Some embodiments employ the use of reactive oxidative species (ROS), such as monatomic oxygen (O), instead of diatomic molecular oxygen ($O_2$), to increase the rate of diffusion into the polymer so that the unreacted, non-oxidized material inside of the fibers may be more efficiently treated. By increasing the overall rate of diffusion, more oxygen will be available to complete the second sub-phase of oxidation, which is the thermosetting phase in the manufacturing of polyacrylonitrile (PAN) based carbon fibers. One particular reactive oxidative species, atomic oxygen, not only has half the mass of molecular oxygen, but also is more chemically reactive and will not need to dissociate after diffusing into the required unreacted interior region of the fiber before it can react with the polyacrylonitrile (PAN).

The reactive oxidative species (ROS) may be the product of a plasma produced in the presence of a process gas. Although air is one process gas for the plasma device, other mixtures of process gases comprising some oxygen mixture or oxygen containing gas may be suitable for particular applications. Examples include, but are not limited to: dry or moist air; nitrogen; oxygen and oxygen-containing gases; nitrogen, nitrogen oxides; carbon monoxide, carbon dioxide; helium, argon or other inert gases; hydrogen and hydrogen-containing gases including ammonia; and mixtures thereof.

In one embodiment, the process gas that is utilized in the oxidation of the polymer precursor for carbon fiber, e.g., polymer tow, that is comprised of polyacrylonitrile (PAN, may include a gas mixture of nitrogen ($N_2$) and diatomic molecular oxygen ($O_2$). The oxygen content, i.e., diatomic molecular oxygen ($O_2$) content, of the gas mixture of nitrogen ($N_2$) and diatomic molecular oxygen ($O_2$) may range from 10% to 100%, and the nitrogen ($N_2$) content of the gas mixture of nitrogen ($N_2$) and diatomic molecular oxygen ($O_2$) may range from 0% to 95%. In some embodiments, the reactive oxidative species that may be created from the process gas by the plasma source include the following: $O_2$, $O_x$, O, $N_xO_y$, $H_xO_y$, and other oxygen containing species, as well as ions, radicals, excited states and metabolic stables of any of the process gas.

In some embodiments, the treatment chamber 100 that includes an inlet 41 for the introduction of heated air into the intermediate heating volume 10, can have part of all of this flow diverted to feed directly into the interior treatment volume 5 of the treatment chamber 100. In some embodiments, the temperature of the intermediate heating volume 5 is controlled by the inlet 41 for introducing heated air directly into the interior treatment volume 5 and the intermediate heating volume 10. The heated air that is introduced to the interior treatment volume 5 by the inlet 41 may be heated using any of the aforementioned convention heating methods that are employed for heating the intermediate heating volume 10.

Referring to FIGS. 1-14B, an electrode assembly 20 may also present in the interior treatment volume 5 of the treatment chamber 100. The electrode assembly 20 may be positioned so that the work piece 6 passes the electrode assembly 20 as traveling from the first end of the treatment chamber 100 to the second end of the treatment chamber 100. In some embodiments, the electrode assembly 20 provides a surface plasma device that can serve three purposes: 1) the generation of heat, reducing the energy requirements of the heater elements feeding the intermediate heating volume 10, 2) the distribution of the heat within the interior treatment volume 5 via electro-hydrodynamic flow inducement, and 3) the generation of highly reactive short-lived species from the process gas introduced to the interior treatment volume 5 by the process gas inlet 30. The term "electro-hydrodynamic flow inducement" is particle or fluid transport produced by an electric field acting on a fluid having a net mobile charge. In some embodiments, the electro-hydrodynamic flow inducement provides convective heating throughout the treatment chamber 100, which results from a combination of the plasma, the geometry of the chamber, and the positioning of the plasma forming electrodes. Due to the close proximity of the work piece 6 to the plasma 40, the highly reactive short-lived species can actively accelerate the oxidation rate of the polymeric material. The plasma 40 formed in the interior heating volume 5 by the electrode assembly 20 produce and sustain a reactive species from the process gas that is introduced to the interior heating volume 5 by the process gas inlet 30. The combination of reactive species and the temperatures produced by the intermediate heating volume 10 are responsible for the accelerated oxidation rate.

In FIGS. 1-8, the plasma generation method is a surface discharge from the electrode assembly 20, wherein at least two electrodes 21, 22, 23 are present on opposing sides of a dielectric barrier 24. In one embodiment, surface discharge plasma generation is characterized by the presence of one or more insulating layers in the current path between metal electrodes in addition to the discharge space. In some embodiments, when the electrodes 21, 22, 23 are electrically excited with alternating current (AC) in a frequency range of 30 Hz to 60 kHz, and when the excitation voltage exceeds the breakdown voltage of the gas surrounding the electrode assembly 20 (also referred to as a panel), a plasma is formed on the surface of the dielectric barrier 24. In some embodiments, the frequency range of the alternating current that is applied to the electrodes 21, 22, 23 may extend to the RF region, i.e., tens of MHz. In one embodiment, the electrodes 21, 22, 23 are excited with an alternating current (AC) in a frequency range of 40 Hz to 50 kHz. The proper generation of this plasma is pressure dependent, but will operate properly over a wide range, typically, but not limited to 1 torr-1500 torr. In some embodiments, the pressure for the generation of the plasma may range from 250 torr to 800 torr. In one example, operation is approximately at atmospheric pressure (760 torr) for ideal integration into currently industrial polymeric fiber conversion lines.

The reactive species of the plasma 40 is produced by applying a voltage to the electrodes 21, 22, 23 in the presence of a process gas that was introduced to the interior treatment volume 5 of the treatment chamber 100 through the process gas inlet 30, in which the process gas is ionized into positively and negatively charged ions, as well as electrons, i.e., the "reactive species" components. The plasma physics of this type of discharge follow the mechanisms of the classic dielectric barrier discharge, where electron avalanching is the main mechanism for ionization. The resulting plasma discharge is in the nonthermal regime, i.e., the electron population absorbs most of the energy from the applied electric field, while the ion and neutral population remains close to room temperature.

Temperature, pressure, plasma physics, electrical characteristics, electrode geometry, and surrounding gas chemistry all contribute in determining the types and quantities of reactive species produced. Particle collisions are the primary mechanism of reactive species generation. The typical principle reactions steps that can occur in a plasma, not limited to a specific plasma operating regime, nor to the invention are electron emission, disassociation and ionization, and recombination listed in the Table 1.

TABLE 1

| Electrons | |
|---|---|
| $e + A \rightarrow A^+ + 2e$ | Ionization |
| $e + A \rightarrow e + A^* \rightarrow e + A + h\nu$ | Excitation |
| $e + A^* + B \rightarrow 2e + A + B^+$ | Penning ionization |
| $e + A \rightarrow e + A$ | Elastic scattering |
| $e + AB \rightarrow e + A + B$ | Dissociation |
| $e + AB \rightarrow 2e + A^+ + B$ | Dissociative ionization |
| $e + AB \rightarrow A^- + B$ | Dissociative attachment |
| $e + A^+ + B \rightarrow A + B$ | Recombination |
| Ions | |
| $A^+ + B \rightarrow A + B^+$ | Charge exchange |
| $A^+ + B \rightarrow A^+ + B$ | Elastic scattering |
| $A^+ + B \rightarrow A^+ + B^+ + e$ | Ionization |
| $A^+ + B \rightarrow A^+ + B^* \rightarrow A^+ + B + h\nu$ | Excitation |
| $A^+ + e + B \rightarrow A + B$ | Recombination |
| $A^+ + BC \rightarrow A^+ + B + C$ | Dissociation |
| $A + BC \rightarrow C + AB$ | Chemical reaction |

The reactions are complex, and typically the reactive species that are detected outside of the plasma volume are the result of multi-step reactions between short-lived reactive species (reaction intermediates) that themselves may not survive outside of the plasma volume. For example, most ionic species may not normally survive outside of the plasma volume due to recombination catalyzed by a third body presence. Nevertheless, ultra-violet photons generated by the plasma volume can extend the life of excited state species and metastables outside of the volume to varying degrees, depending on processing conditions.

In some embodiments, a surface plasma is generated in close proximity to the work piece, i.e., work piece 6, in an interior treatment volume 5 that can be heated in a range from room temperature to 300° C. to accelerate the chemical transformation mechanisms of the work piece, e.g., oxidation of the polymeric precursor. As used herein, the term "close proximity" means that the distance D4 between the work piece 6, e.g., fiber tow, and the dielectric barrier 24 of the electrode assembly 20 is 30 cm or less. For example, the distance D4 between the work piece 6, e.g., fiber tow, and the dielectric barrier 24 of the electrode assembly is 20 cm, 18 cm, 16 cm, 14 cm, 12 cm, 10 cm, 8 cm, 6 cm, 4 cm, 2 cm or 1 cm. Any range resulting from any two of the foregoing values is also contemplated herein. For example, the distance D4 between the work piece 6, e.g., fiber tow, and the dielectric barrier 24 may range from 1 cm to 15 cm. In another embodiment, the distance D4 between the work piece 6, e.g., fiber tow, and the dielectric barrier 24 may range from 5 cm to 10 cm.

In some embodiments, by positioning the plasma volume 40 in close proximity D4 to the work piece 6, i.e., fiber tow, the more short-lived reactive species can play a greater role in the chemical processing of the work piece 6. For example, in some embodiments, it is estimated that the reactive species from the plasma volume can reach the work piece 6, i.e., fiber tow, in a time on the order of $10^{-4}$ seconds. In comparison, remote exposure (RE) plasma treatment methods may take on the order of seconds for the reactive species from the plasma to reach the work piece 6, i.e., fiber tow. In some embodiments, the geometry of the electrodes 21, 22, 23 of the electrode assembly 20, as well as the positioning of the electrode assembly 20 within the interior treatment volume 5 of the treatment chamber 100 may impact the electrohydrodynamic flow inducement within the interior treatment volume 5 that accelerates the reactive species of the plasma towards the work piece 6, i.e., fiber tow. It is noted that the electro-hydrodynamic flow inducement effects are not necessary for every embodiment of the present disclosure.

FIGS. 1, 2A, 4A and 4B illustrate one embodiment in which the electrode assembly 20 includes two upper electrodes 21, 22 and a single lower electrode 23 that are separated by a dielectric barrier 24. The two upper electrodes 21, 22 are present on a first side of the dielectric barrier 24, and the single lower electrode 23 is present on a second opposing side of the dielectric barrier 24. The two upper electrodes 21, 22 have a rectangular geometry, in which the length of the two upper electrodes 21, 22 is parallel to the direction of travel for the work piece 6. FIGS. 3A and 3C depict another embodiment of the present disclosure that also includes two upper electrodes 21, 22 having a rectangular geometry, in which the length of the electrodes 21, 22 is perpendicular to the direction of travel for the work piece 6. FIG. 3B depicts yet another embodiment of the present disclosure, in which only a single electrode 22' is present on one side, i.e., upper surface, of the barrier dielectric 24, and a single lower electrode 23 is present on the other side, i.e., lower surface, of the barrier dielectric 24.

Referring to FIGS. 1-8, in one embodiment, the electrodes 21, 22, 23 of the electrode assembly 20 that provides the reactive species producing plasma 40 are composed of an electrically conductive material, such as platinum, aluminum, copper, gold, silver and combinations thereof. When the upper electrodes 21, 22 have a rectangular geometry, the length of the electrodes may range from 2 cm to 5000 cm, the width of the electrodes 21, 22 may range from 0.01 cm to 10 cm, and the thickness of the electrodes 21, 22 may range from 0.01 cm to 10 cm. Referring to FIG. 2A, in one embodiment, the distance D3 that is separating the upper electrodes 21, 22 from one another may range from 1 cm to 500 cm. The single lower electrode 23 may have a width that extends from the first electrode 21 of the upper electrodes 21, 22 to the second electrode 22 of the upper electrodes 21, 22. In some examples, the outer edges of the single lower electrode 23 may be substantially aligned with the outer edges of the first upper electrode 21 and the second upper electrode 22. For example, the single lower electrode 23 may have a width ranging from 0.01 cm to 500 cm. The thickness of the single lower electrode 23 may range from 0.01 cm to 10 cm. The above dimensions are typical of solid electrodes. In addition to solid electrode configurations, the electrodes may also be hollow electrodes.

In some embodiments, the upper electrodes 21, 22 may be referred to as high voltage electrodes, and the single lower electrode 23 may be referred to as a ground electrode. In one embodiment, the dielectric barrier 24 is composed of a ceramic material. For example, the dielectric barrier 24 may be composed of silicon oxide ($SiO_2$), borosilicate family of glasses, soda lime glass, silicon nitride ($Si_3N_4$), alumina ($Al_2O_3$), aluminosilicates, polyaluminosilicate ceramic (policor), mica in all of its variations (e.g., biotite, muscovite, phlogopite, etc.), most temperature-stable dielectric materials, any non-conducting ceramic and high temperature polymer, and combinations thereof. The thickness of the dielectric barrier 24 may range from 0.01 cm to 10 cm.

Figure 5:
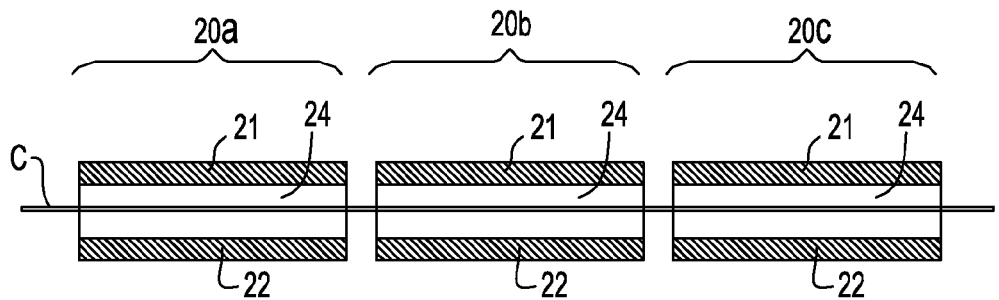
FIG. 5 is a top down view depicting a plurality of dielectric barrier plasma discharge electrode assemblies positioned in line within the interior treatment volume of a treatment chamber having a work piece passing therethrough, wherein each of the electrodes have a rectangular geometry with a length that is parallel to the length of the work piece, in accordance with one embodiment of the present disclosure.

The electrode assembly 20 may also be referred to as a panel. Any number of electrode assemblies 20 may be present within the interior treatment volume 5 of the treatment chamber 100. In one embodiment, the number of electrode assemblies 20 that are present in the interior treatment volume 5 of the treatment chamber 100 may be selected to correspond to the number of treatments that are desired to be performed on the work piece 6. FIGS. 5-8 depict some embodiments of the present disclosure illustrating the positioning of the electrode assemblies 20 within the interior treatment volume 5 of the treatment chamber 100. The electrode assemblies 20 depicted in FIGS. 5-7 each include two upper electrodes 21, 22 that are present on a dielectric surface 24, and are separated from one another, as described above. FIG. 5 depicts one embodiment of the present disclosure including multiple electrode assemblies 20a, 20b, 20c that are arranged in series, i.e., in-line. The electrode assemblies 20a, 20b, 20c that are depicted in FIG. 5 are positioned so that the length of the upper electrodes 21, 22 of the electrode assemblies 20a, 20b, 20c is parallel to the length of travel for the work piece 6. Although the embodiment that is depicted in FIG. 5 indicates discrete units for the electrode assemblies 20a, 20b, 20c, the configuration may also appear as one continuous unit when viewed from the outside of the device, while being internally divided. Additionally, a module that appears as one oven on the outside, could in fact have a temperature gradient on the inside, or it could have internal dividers that define these temperature gradients.

Figure 6:
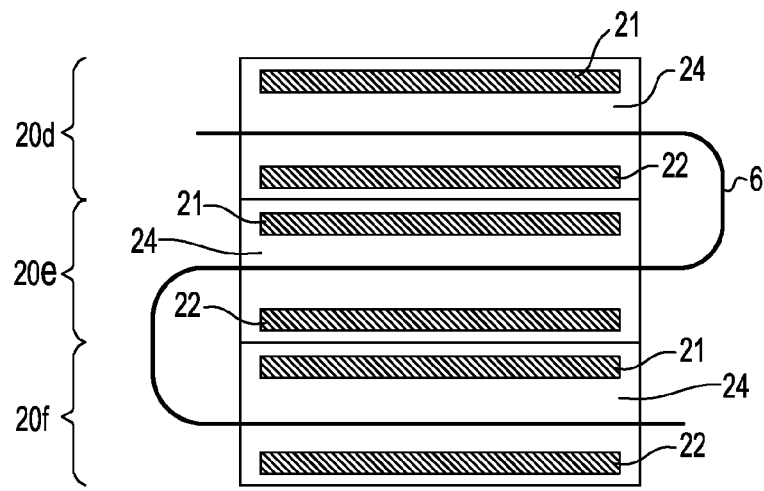
FIG. 6 is a top down view depicting another embodiment of a plurality of plasma generating electrode assemblies within the interior treatment volume of the treatment chamber for a plasma treatment apparatus, in accordance with one embodiment of the present disclosure.

FIG. 6 depicts one embodiment of the present disclosure, in which the work piece 6 passes through the interior treatment volume 5 numerous times, wherein each time the work piece 6 passes through the interior treatment volume it passes over a different electrode assembly 20d, 20e, 20f. The electrode assemblies 20d, 20e, 20f that are depicted in FIG. 6 are positioned so that the length of the upper electrodes 21, 22 of the electrodes assemblies 20d, 20e, 20f is parallel to the length of travel for the work piece 6.

Figure 7:
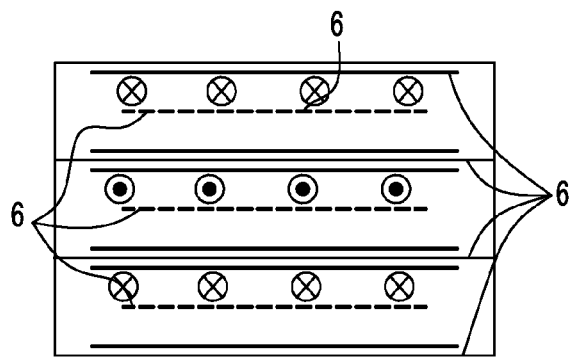
FIG. 7 is a front view of an oxidation module illustrating one embodiment of a multi-pass configuration, in accordance with one embodiment of the present disclosure.

FIG. 7 is a front view of an oxidation module illustrating a multi-pass configuration. The circle with the x inside represents the direction of the plane going into the paper, and the circle with the point inside represents the direction of the plane coming out of the paper. The three dashed lines 6 represent a row of individual fiber tows (of whatever size). The electrode assemblies 20' may be situated on the top and the bottom of each multi pass chamber. However, in some embodiments, it is not necessary to have an electrode assembly 20' at the top and bottom of each chamber, there could be just one on the top, and one on the bottom. The number of multi-passes can range from 2 to 50.

Figure 8:
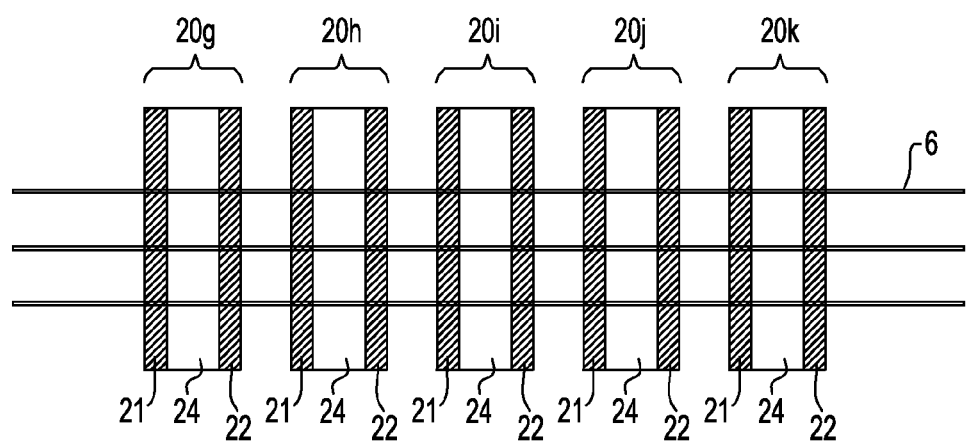
FIG. 8 is a top down view depicting a plurality of dielectric barrier plasma discharge electrode assemblies positioned in line within the interior treatment volume of a treatment chamber of a plasma treatment apparatus having a work piece passing therethrough, wherein the electrodes have a rectangular geometry and the length of the electrode assemblies is perpendicular to the length of the work piece, in accordance with one embodiment of the present disclosure.

FIG. 8 depicts another embodiment of the present disclosure, in which a plurality of electrode assemblies 20g, 20h,

20i, 20j, 20k are positioned in-line. In this embodiment, the length of the upper electrodes 21, 22 of the electrode assemblies 20g, 20h, 20i, 20j, 20k is perpendicular to the length of the work piece 6. The examples of the electrode assemblies that are depicted in FIGS. 1-8 are provided for illustrative purposes only, and are not intended to limit the present disclosure. It is noted that a wide variety of possible electrode geometries exist for the methods and structures disclosed herein.

Figure 9:
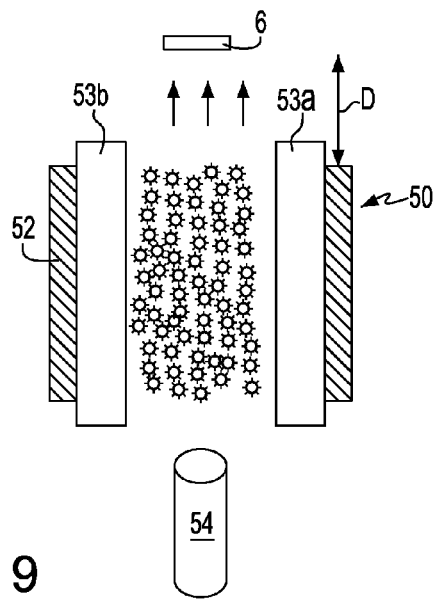
FIG. 9 is a front view depicting another embodiment of a plurality of plasma generating electrode assemblies for positioning within the interior treatment volume of the treatment chamber of a plasma treatment apparatus that does not induce an electrohydrodynamic flow effect, in accordance with the present disclosure.

For example, FIG. 9 depicts one embodiment of a plasma generating electrode assembly 50 for positioning within the interior treatment volume 5 of a CPIE plasma treatment apparatus that generates a reactive species, but does not induce an electrohydrodynamic flow effect. The plasma generating electrode assembly 50 includes a parallel plate configuration with a first electrode 51 and a second electrode 52 having at least one dielectric layer 53a, 53 present between the first electrode 51 and the second electrode 52. In some embodiments, a first dielectric layer 53a, i.e., first dielectric barrier, is present on the first electrode 51, and a second dielectric layer 53b, i.e., second dielectric barrier, is present on the second electrode 52. It is not required that both the first and second dielectric layer 53a, 53b be present between the first and second electrode 51, 52, so long as at least one of the first and second dielectric layer 53a, 53b be present between the first and second electrode 51, 52. There is no asymmetry between the electrodes 51, 52 in this embodiment, and therefore there is no electrohydrodynamic flow inducement. In this configuration, the process gas from a gas inlet 54 is injected through the plasma volume 40 where the reactive species are generated, and the injection momentum is sufficient to transport the reactive species to the work piece 6. Similar to the embodiments that are depicted in FIGS. 1-7, in this embodiment the distance between the first and second electrodes 51, 52 and the work piece 6 is selected so that the work piece 6 is in close proximity D5 to the first and second electrodes 51, 52. For example, the distance D5 between the work piece 6, e.g., fiber tow, and the first and second electrodes 51, 52 of the electrode assembly 50 is 20 cm, 18 cm, 16 cm, 14 cm, 12 cm, 10 cm, 8 cm, 6 cm, 4 cm, 2 cm or 1 cm. Any range resulting from any two of the foregoing values is also contemplated herein. For example, the distance D5 between the work piece 6, e.g., fiber tow, and the first and second electrodes 51, 52 of the electrode assembly 50 may range from 1 cm to 15 cm. In another embodiment, the distance D5 between the work piece 6, e.g., fiber tow, and first and second electrodes 51, 52 of the electrode assembly 50 may range from 5 cm to 10 cm.

Figure 10:
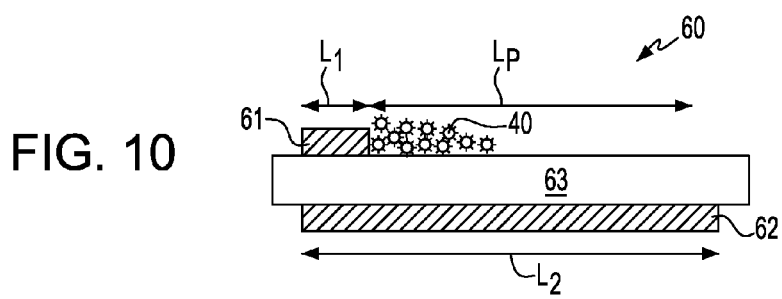
FIG. 10 is a front view depicting another embodiment of a single or plurality of plasma generating electrode assemblies within the interior treatment volume of the treatment chamber of a plasma treatment apparatus, in which the difference between the length of the electrodes induces an electrohydrodynamic flow effect, in accordance with the present disclosure.

FIGS. 10-14B depict embodiments of the present disclosure of additional surface discharge plasma generating electrodes that can generate the reactive species and provide for electrohydrodynamic flow inducement. As discussed above, electrohydrodynamic flow inducement can accelerate the reactive species that is generated by the plasma towards the work piece 6. FIG. 10 is one embodiment of a surface barrier discharge plasma generating electrode assembly 60 that illustrates the asymmetrical geometry of the electrodes, which contributes to the electrohydrodynamic flow inducement. In some embodiments, the electrohydrodynamic flow inducement may result from the difference in length Lp between the length $L_1$ of the top electrode 61 and the length $L_2$ of the bottom electrode 62, where a plasma 40 is generated on and near the surface of the dielectric barrier 63 due to proper excitation. This length difference $L_P$ can provide the asymmetry to induce flow, i.e., electrohydrodynamic flow inducement, which can result in the formation in the later discussed flow vortices. The electrodes assemblies 60 depicted in FIG. 10 may be substituted for the electrode assemblies present within the interior treatment volume 5 that is depicted in FIGS. 1-4A or may be arranged similar to the electrode assemblies depicted in FIGS. 5-8. The electrode geometry that is depicted in FIG. 10 is only one example of an electrode geometry that can provide electrohydrodynamic flow inducement. A wide variety of electrode geometries can exist that can take advantage of this asymmetry. For example, FIGS. 11A-14B provide some examples of asymmetrical electrode geometries that can provide an electrohydrodynamic flow inducement that can accelerate the reactive species that is generated by the plasma towards the work piece 6.

Figure 11A:
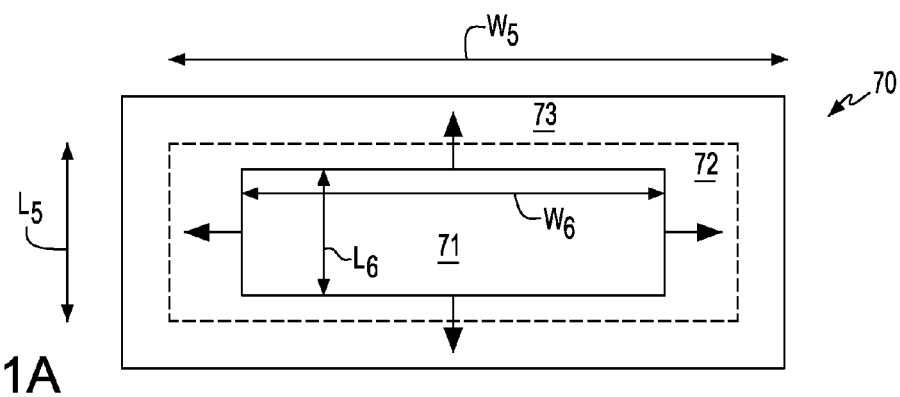
FIG. 11A depicts a top down view of another embodiment of a plasma generating electrode assembly having a rectangular geometry, in accordance with the present disclosure.
Figure 11B:
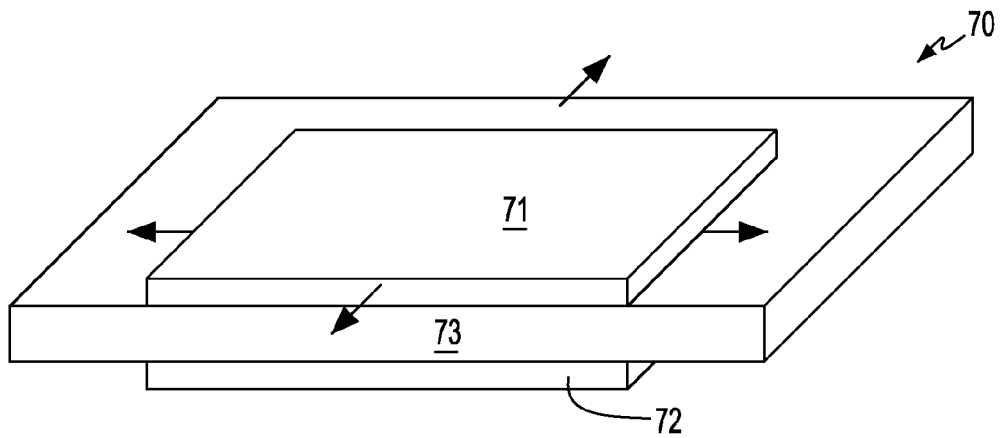
FIG. 11B is a cross-sectional isometric view of the plasma generating electrode assembly that is depicted in FIG. 11A.
Figure 12A:
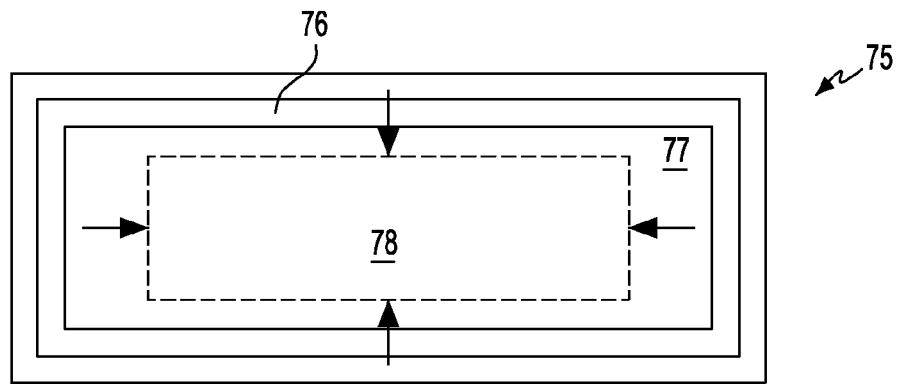
FIG. 12A depicts a top down view of another embodiment of a plasma generating electrode assembly having a rectangular geometry, in accordance with the present disclosure.
Figure 12B:
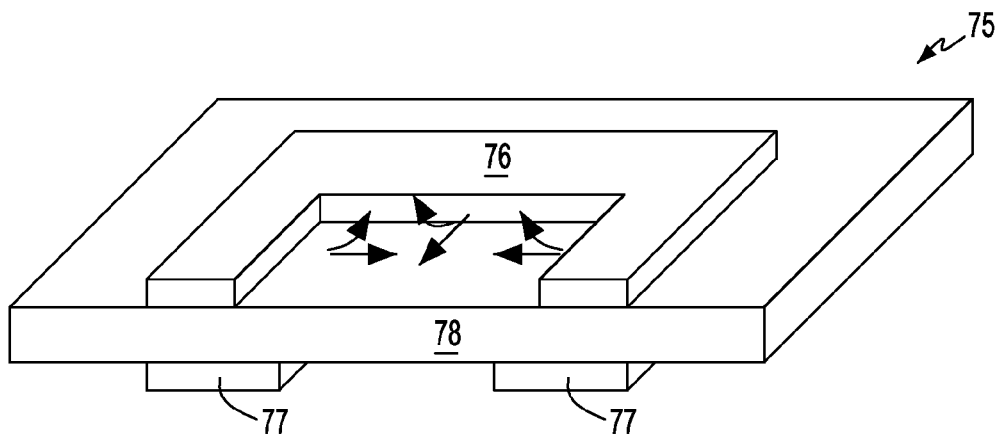
FIG. 12B is a cross-sectional isometric view of the plasma generating electrode assembly that is depicted in FIG. 12A.

FIGS. 11A and 11B depict one embodiment of an electrode assembly 70 having rectangular shaped upper and lower electrodes 71, 72 that are separated by a dielectric layer 73. The width W5 and length L5 of the lower electrode 72 is greater than the width W6 and the length L6 of the upper electrode 71 to provide an asymmetric geometry that provides for electrohydrodynamic flow inducement. FIGS. 12A and 12B depict another embodiment of an electrode assembly 75 having a rectangular shaped upper electrode 76 and a rectangular shaped lower electrode 77 separated by a dielectric layer 78, in which a rectangular opening is present in each of the upper electrode 76 and the lower electrode 77. Similar to the electrode assembly 70 depicted in FIGS. 11A and 11B, the difference in dimensions of the upper electrode 76 and the lower electrode 77 in the electrode assembly 75 depicted in FIGS. 12A and 12B provides for electrohydrodynamic flow inducement of reactive species generated by the plasma produced by the electrode assembly 75. The electrodes assemblies 70, 75 depicted in FIGS. 11A-12B may be substituted for the electrode assemblies present within the interior treatment volume 5 that is depicted in FIGS. 1-4A or may be arranged similar to the electrode assemblies depicted in FIGS. 5-8. The arrows depicted in FIGS. 11A-12B depict the direction of the electrohydrodynamic flow inducement produced by the electrode assemblies 70, 75. With the electrode assembly 75 depicted in FIGS. 12A and 12B, a vertical electrohydrodynamic flow inducement may be achieved by directing multi-directional flows toward each other causing a net upward flow.

Figure 13A:
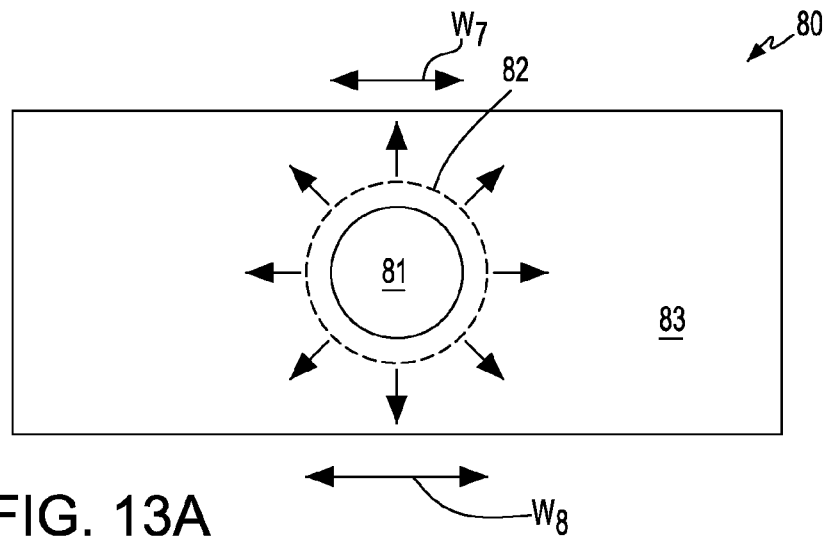
FIG. 13A depicts a top down view of another embodiment of a plasma generating electrode assembly having a circular geometry, in accordance with the present disclosure.
Figure 13B:
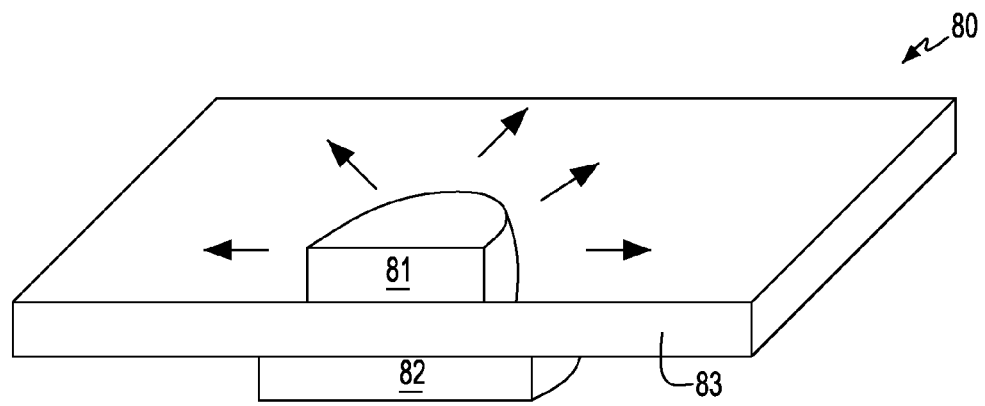
FIG. 13B is an isometric cross-sectional view of the plasma generating electrode assembly that is depicted in FIG. 13A.
Figure 14A:
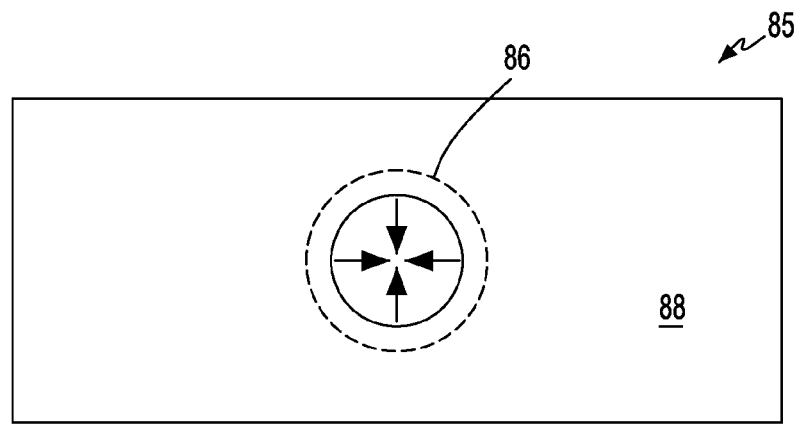
FIG. 14A depicts a top down view of another embodiment of a plasma generating electrode assembly having a circular geometry, in accordance with the present disclosure.
Figure 14B:
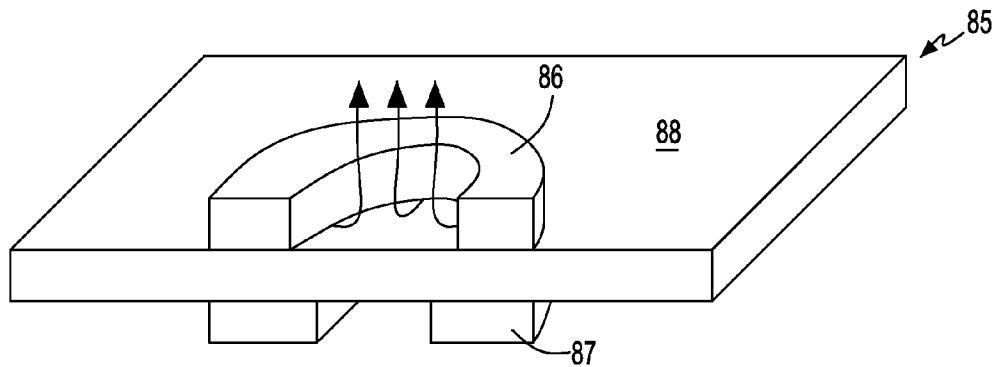
FIG. 14B is an isometric cross-sectional view of the plasma generating electrode assembly having a circular geometry that is depicted in FIG. 14A.

FIGS. 13A and 13B depict one embodiment of a plasma generating electrode assembly 80 having a circular geometry in which an upper circular electrode 81 is separated from a lower circular electrode 82 by a dielectric layer 83, wherein the difference in between the width W7 of upper electrode 81 and the width W8 of the lower electrode 82 provides an asymmetrical electrode assembly 80 that produces an electrohydrodynamic flow inducement effect that can accelerate the reactive species that are generated by the plasma. FIGS. 14A and 14B depict another embodiment of an electrode assembly 85 having a circular shaped upper electrode 86 and a circular shaped lower electrode 87 separated by a dielectric layer 88, in which a circular opening is present in each of the upper electrode 86 and the lower electrode 87. Similar to the electrode assembly 80 depicted in FIGS. 13A and 13B, the difference in dimensions of the upper electrode 86 and the lower electrode 87 in the electrode assembly 85 depicted in FIGS. 14A and 14B provides for electrohydrodynamic flow inducement of reactive species generated by the plasma produced by the electrode assembly 85. The electrodes assemblies 80, 85 depicted in FIGS. 13A-15B may be substituted for the electrode assemblies present within the interior treatment volume 5 that is depicted in FIGS. 1-4A or may be arranged similar to the electrode assemblies depicted in FIGS. 5-8. The arrows depicted in FIGS. 13A-14B depict the direction of the electrohydrodynamic flow inducement produced by the electrode assemblies 80, 85. With the electrode assembly 85 depicted in FIGS. 14A and 14B, a vertical electrohydrodynamic flow inducement may be achieved by directing multi-directional flows toward each other causing a net upward flow.

The examples depicted in FIGS. 9-14B can be scaled in size or number, by creating arrays of these shapes in either planar direction. Additional geometrical shapes for the electrode assemblies of the CPIE plasma treatment apparatus can be imagined and implemented in this disclosure, such as triangles, stars, ellipsoids and combinations thereof.

Referring to FIGS. 1-8 and 10-14B, in some embodiments, the plasma volume 40 produced by the electrode assembly 20, 60, 70, 75, 80, 85 can induce flow, i.e., an electrohydrodynamic flow inducement, in the neutral gas in its immediate surroundings, resulting in bulk acceleration of plasma-generated reactive species from the volume directly to the work piece 6, e.g., fiber tow, and circulation and distribution of heat inside the interior treatment volume 5. The circulation and distribution of heat and reactive species inside the interior treatment volume 5 that results from the plasma formation combined with the chamber walls may be referred to as "flow vortices". In some embodiments, the chamber walls, i.e., inner shell 9, that define the geometry of the interior treatment volume 5 provide a boundary condition for the flow vortices.

More specifically, in some embodiments, the proper construction of the electrode assembly 20, 60, 70, 75, 80, 85 (also referred to as panel) results in the generation of an asymmetrical electric field gradient that provides the flow acceleration of the ionic species of the plasma 40 which, through primarily elastic collisions, causes a flow inducement, i.e., electrohydrodynamic flow inducement, in the neutral gas in a specified direction at a velocity of up to 10 meters per second depending on the exact geometrical arrangement of electrode assembly 20, 60, 70, 75, 80, 85, as well as the voltage applied to the electrode assembly, frequency applied to the electrode assembly, the spacing between adjacent electrodes, the shape of the electrodes and the chemistry of the electrodes. For example, in one embodiment, the reactive species may be accelerated by the flow vortices towards the work piece 6 at a velocity so that the reactive oxidative species reaches the work piece 6 within $10^{-3}$ seconds. In another embodiment, the reactive species may be accelerated by the flow vortices towards the work piece 6 at a velocity so that the reactive oxidative species reaches the work piece 6 within $10^{-4}$ seconds. In yet another embodiment, the reactive species may be accelerated by the flow vortices towards the work piece 6 at a velocity so that the reactive oxidative species reaches the work piece 6 within $10^{-5}$ seconds.

The flow vortices also provide that the heat produced within the interior treatment volume 5 by the intermediate heating volume 10 and the inlet 41 for introducing heated air directly into the interior treatment volume 5 be uniformly distributed throughout the interior treatment volume 5. In some embodiments, there are three primary factors contributing to temperature uniformity. There is the injection of gas flow into the interior treatment volume 5, the plasma discharge occurring in the interior treatment volume 5, and the thermal uniformity of the interior treatment volume wall 9. In some embodiments, the plasma 40 also provides a heat source. In some embodiments that utilize a dielectric barrier electrode assembly, the plasma discharge becomes a heat source due to the particle energy conversion from the electrical excitation. The plasma 40 can provide heat both through the dielectric heating phenomenon and the impartation of energy to the ion and neutral populations of the plasma and gas atmosphere within the interior treatment volume 5. The additional heat source provided by the plasma 40 can increase the temperature of the interior treatment volume 5 beyond the heat that is provided by the intermediate heating volume 10 that is described above. This feature produces a more energy efficient process and provides a new mechanism of thermal control over the process not was not previously possible. In a scaled implementation, where multiple, independently-controlled electrode assemblies are installed, each assembly can generate more or less heat, in proportion to the degree of power delivered to each assembly, which can be taken advantage of to create a more precise, uniform heating effect, or conversely, create a precise temperature gradient along the path of the continuous work piece to produce specialized effects on the process. In general, comparing a plasma condition, which includes convective heating plus the plasma and no process gas flow to a convective heating condition without a plasma (also referred to as fully off), which includes convective heating only, without a plasma, and no process gas flow, the plasma condition provides a more uniform vertical temperature gradient than the convective heating without plasma condition. For example, in one embodiment, it cuts the gradient close to half. In other words, in a static heating chamber, one typically has a temperature change from low to high from bottom to top of the chamber. The plasma condition, as employed in the methods and structures disclosed herein, can reduce that temperature change in roughly half.

Figure 19A:
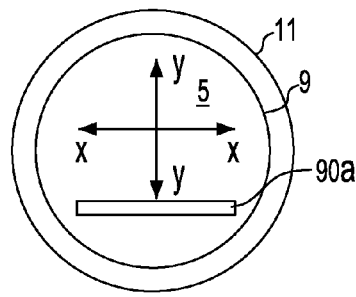
FIG. 19A is an end cross-sectional view of a close proximity indirect exposure (CPIE) plasma treatment device that includes multiple electrode assemblies, in accordance with one embodiment of the present disclosure.
Figure 19B:
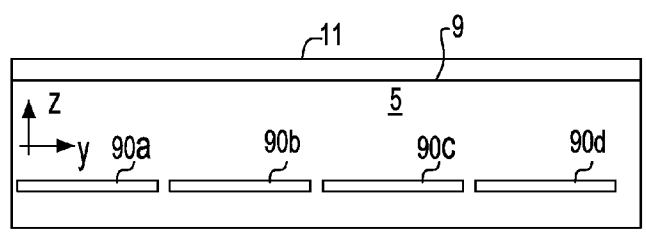
FIG. 19B is a side cross-sectional view of a close proximity indirect exposure (CPIE) plasma treatment device that is depicted in FIG. 19A.

Although temperature uniformity throughout the entire interior treatment volume 5 is one embodiment of the present disclosure it is not a requirement of every embodiment of the present disclosure. For example, embodiments have been contemplated, in which the temperature of the interior treatment volume 5 is varied along its length, i.e., y-direction, as depicted in FIGS. 19A and 19B. Referring to FIG. 19A, the x-direction and the z-direction within the interior treatment volume 5 are typically the most important directions for maintaining temperature uniformity. Referring to FIG. 19B, in some embodiments, a temperature gradient or uniform temperature can be produced along the length, i.e., y-direction, of the interior treatment volume 5 by adjusting the heat produced by each of the plasma forming electrode assemblies 90a, 90b, 90c, 90d. For example, to provide a temperature gradient, each plasma producing electrode assembly 90a, 90b, 90c, 90d can be independently energized to enable precise thermal control along the y-direction.

Figure 2A:
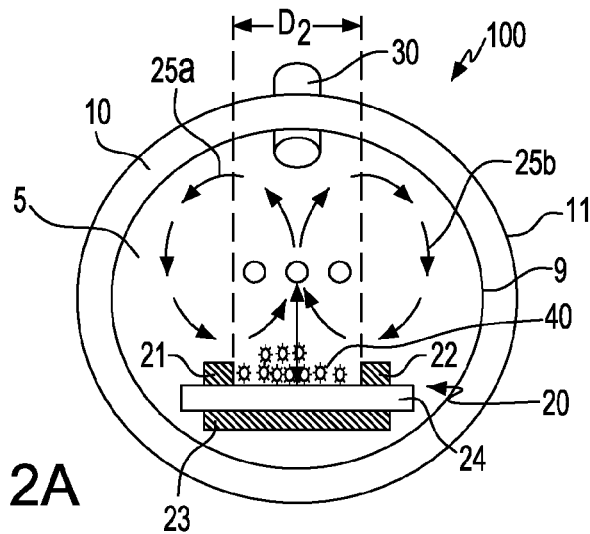
FIG. 2A is an end cross-sectional view of a treatment chamber for applying a close proximity indirect exposure (CPIE) plasma treatment to a work piece, wherein an electrode assembly that is present within the treatment chamber includes rectangular shaped plasma generating electrodes, in which the length of the electrodes is parallel to the length of the work piece, in accordance with one embodiment of the present disclosure.
Figure 2B:
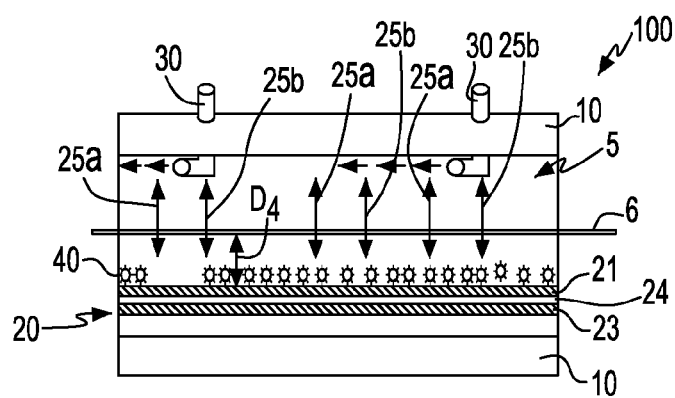
FIG. 2B is a side cross-sectional view of the treatment chamber that is depicted in FIG. 2A, in accordance with one embodiment of the present disclosure.
Figure 3A:
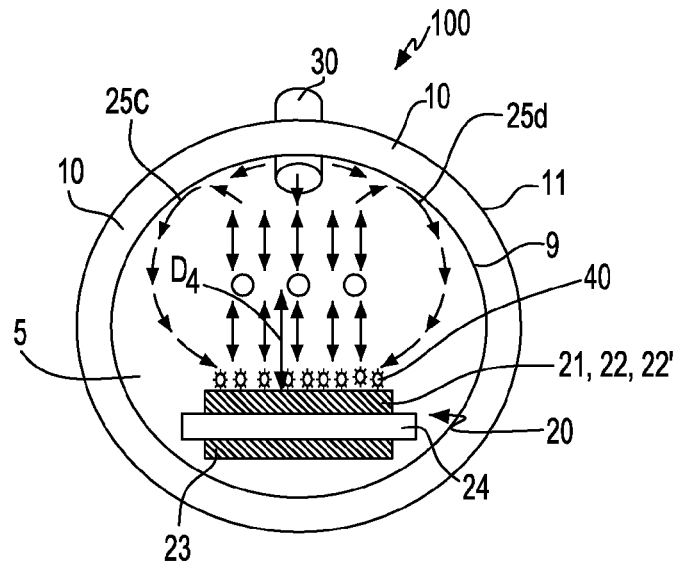
FIG. 3A is an end cross-sectional view of a treatment chamber for providing a close proximity indirect exposure (CPIE) plasma treatment to a work piece, wherein an electrode assembly that is present within the treatment chamber includes rectangular shaped plasma generating electrodes, in which the length of the electrodes is perpendicular to the length of the work piece, in accordance with the present disclosure.
Figure 3B:
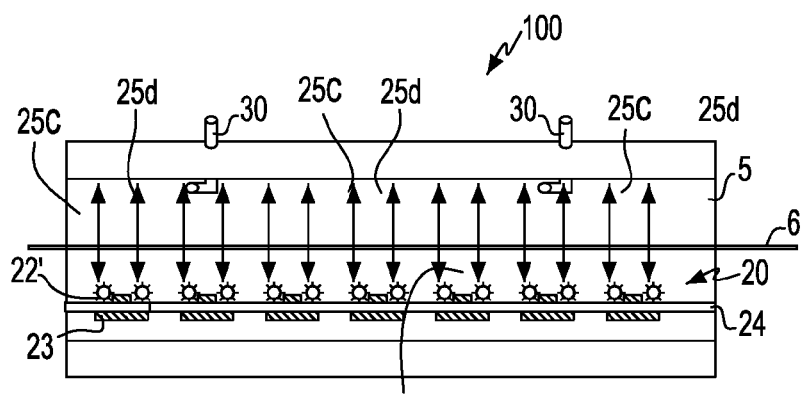
FIG. 3B is a side cross-sectional view of the plasma treatment apparatus that is depicted in FIG. 3A, in accordance with one embodiment of the present disclosure.
Figure 3C:
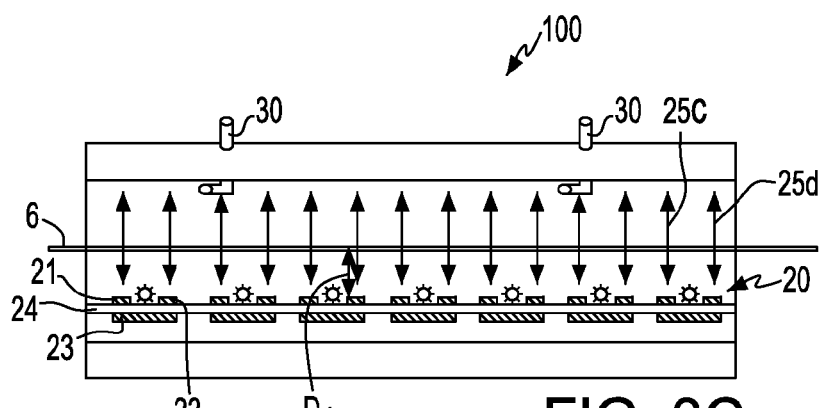
FIG. 3C is a side cross-sectional view of another embodiment of a plasma treatment apparatus, in accordance with one embodiment of the present disclosure.

Referring to FIGS. 2A, 2B and 7, in one embodiment in which the electrode assembly 20 includes upper electrodes 21, 22 having a length that is parallel to the direction of travel for the work piece 6, the flow vortices 25a, 25b circulate above each of the upper electrodes 21, 22. In FIGS. 2A, 2B and 6, the length of the upper electrodes 21, 22 is parallel to the length of the treatment chamber 100. Therefore, the axis by which the flow vortices 25a, 25b encircle is parallel to the length of the treatment chamber 100. Each axis for each flow vortices 25a, 25b is present over one of the upper electrodes 21, 22.

Referring to FIGS. 2A, 2B and 6, in one embodiment, a first flow vortex 25a that is present over a first upper electrode 21 is substantially circular and extends from the first electrode 21 upwards in a first rotation, e.g., counter clockwise rotation, towards the work piece 6 between the first and second electrode 21, 22, and a second flow vortex

25b that is present over a second upper electrode 22 is substantially circular and extends from the second electrode 22 upwards in a second rotation, e.g., clockwise rotation, towards the work piece 6. The second rotation of the second vortex 25b is in an opposite direction as the first rotation of the first vortex 25a.

In some embodiments, the reactive species of the plasma 40 that would normally diffuse out of the plasma volume at a very low velocity will instead be accelerated by the flow vortices 25a, 25b directly towards the work piece 6, e.g., the fiber tow, dramatically increasing the rate of exposure of the reactive species to the work piece 6, and causing an increase in the rate of desired chemical transformation. In addition, this flow inducement provided by the flow vortices 25a, 25b also serves to generate an internal circulation of the temperature, i.e., heat, within the interior treatment volume 5, which greatly aids in the uniformity and chemical reaction rate.

Figure 4A:
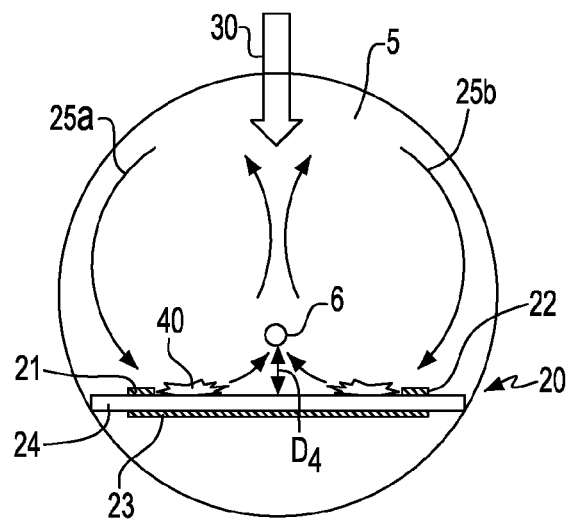
FIG. 4A is an end cross-sectional view of a treatment chamber including an electrode assembly that includes a dielectric barrier and at least two plasma generating electrodes that are configured in such a way as to generate a plasma and induce flow, wherein in combination with the surrounding volume constraints, produce flow vortices that accelerate the reactive species produced by the plasma and promote thermal uniformity within the interior treatment volume of the treatment chamber, in accordance with one embodiment of the present disclosure.
Figure 4B:
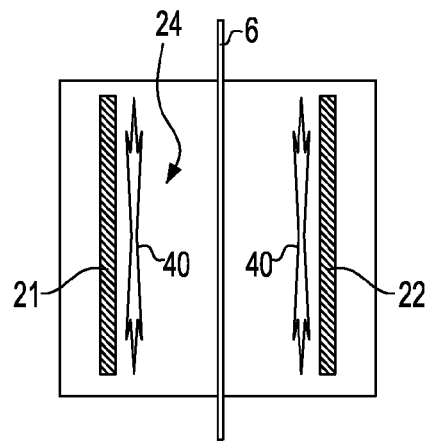
FIG. 4B is a top down view along section line B-B of the treatment chamber that is depicted in FIG. 4A.

The flow vortices 25a, 25b that are depicted in FIGS. 2A, 2B and 4A are only one example of the flow vortices 25a, 25b that can be formed within the interior treatment volume 5 of the treatment chamber 100. For example, FIGS. 3A-3C depict another embodiment of the present disclosure, in which the upper electrodes 21, 22, 22' are positioned within the interior treatment volume 5 of the treatment chamber 100 so that the length of the upper electrodes 21, 22, 22' is substantially perpendicular to the direction of travel of the work piece 6. Similar to the configurations of the electrode assemblies 20 that are depicted in FIGS. 2A, 2B and 4A, the electrode assemblies 20 depicted in FIGS. 3A-3C result in the generation of an asymmetrical electric field gradient. The asymmetrical electrical field in combination with the geometry of the walls of the interior treatment volume 5 of the chamber 100 induces mechanical flow that accelerates the ionic species, i.e., reactive species, of the plasma 40 which, through mostly elastic collisions, causes a flow inducement, i.e., electro-hydrodynamic flow inducement, in the neutral gas in a specified direction at a velocity of up to tens of meters per second. In FIGS. 3A-3C, in which the upper electrodes 21, 22, 22' have a length that is perpendicular to the direction of travel for the fiber tow 6, the flow vortices 25c, 25d circulate above each of the upper electrodes 21, 22, 22'.

In FIGS. 3A-3C, the length of the upper electrodes 21, 22, 22' is perpendicular to the length of the treatment chamber 100. Therefore, the axis by which the flow vortices 25c, 25d encircle is perpendicular to the length of the treatment chamber 100. Each axis for each flow vortices 25c, 25d is present over one of the upper electrodes 21, 22, 22'. Referring to FIGS. 3A-3C, in one embodiment, a first flow vortice 25c, 25d may be substantially circular. Similar to the flow vortices 25a, 25b depicted in FIGS. 2A, 2B and 4A, the flow vortices 25c, 25d provide that the reactive species of the plasma 40 are accelerated directly towards the work piece, e.g., the fiber tow 6, increasing the rate of exposure of the reactive species to the work piece, and causing an increase in the rate of desired chemical transformation. Further, in some embodiments, the flow inducement provided by the flow vortices 25c, 25d serves to generate an internal circulation of the temperature, i.e., heat, within the interior treatment volume 5, which greatly aids in the uniformity and chemical reaction rate.

It is noted that the electrode assemblies 20, 20a, 20b, 20c, 20d, 20e, 20f, 20g, 20h, 20i, 20j, 20k for the dielectric barrier discharge plasma that are depicted in FIGS. 1-7 are only some examples of electrode assemblies for forming a plasma 40 and reactive species for treating a work piece 6. For example, other capacitive coupling techniques in addition to dielectric barrier discharges, such as corona discharges, hollow cathode discharges, low pressure discharges (some in the field separate out discharges at DC as diode discharges, such as arcs or low pressure discharges) and combinations thereof can also be employed with the methods and structure disclosed herein. In addition to capacitive discharges, the plasmas and reactive species for treating the work piece 6 may also include inductive and electromagnetic wave coupling methods. Further, there are several implementations that combine capacitive coupling with the inductive and electromagnetic wave coupling methods. Typically, the plasma method employed herein is within the non-thermal physical regime.

Figure 15:
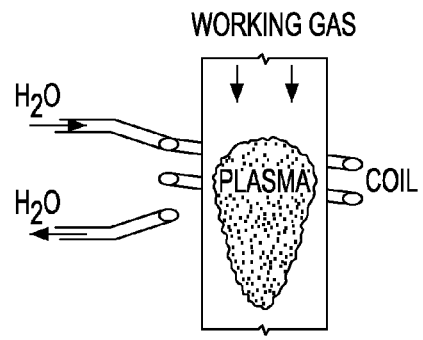
FIG. 15 is a pictorial view of an inductive plasma torch.
Figure 16:
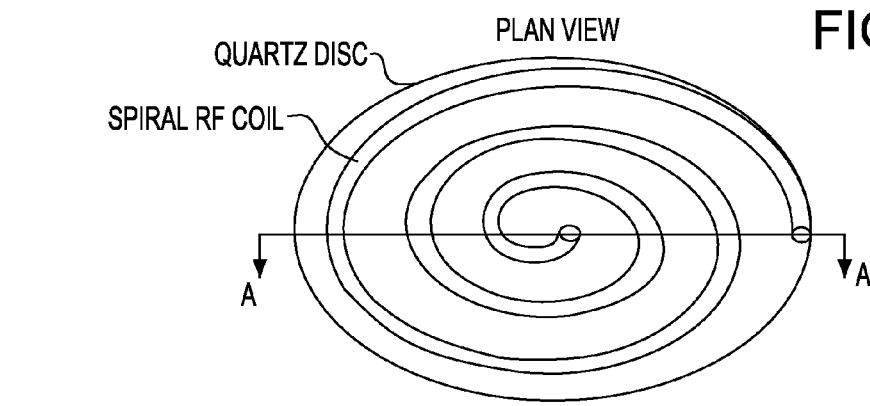
FIG. 16 is a schematic view of an inductive plasma torch with a planar configuration.

Inductively coupling involves the utilization of magnetic fields to generate and confine plasma discharges in a wide range of pressure, for thermal and non-thermal physical regimes. Various implementations exist, such as helicons, torches, and jets. In the inductively coupled approach, typically coils of various materials are constructed in such a way that passing large currents through them generates and/or contains a plasma discharge. A common configuration, the inductive plasma torch, is shown in FIG. 15, while a planar configuration is in FIG. 16. Typically, the discharge energies required to sustain an inductive plasma are large enough to cause the plasma to operate in the thermal regime, in which all three main species populations (electrons, ions, and neutrals) are at the same temperature. However, in some embodiments, an optimal configuration utilizing the inductive coupling technique would require operation in the non-thermal regime. Here, a combination of magnetic and electric excitation in close proximity to the polymeric material, i.e., work piece 6, may produce the desired result.

Figure 17:
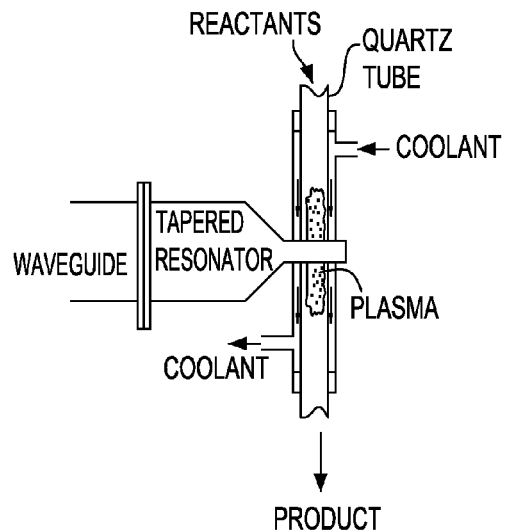
FIG. 17 is a schematic view of a microwave plasma device.
Figure 18:
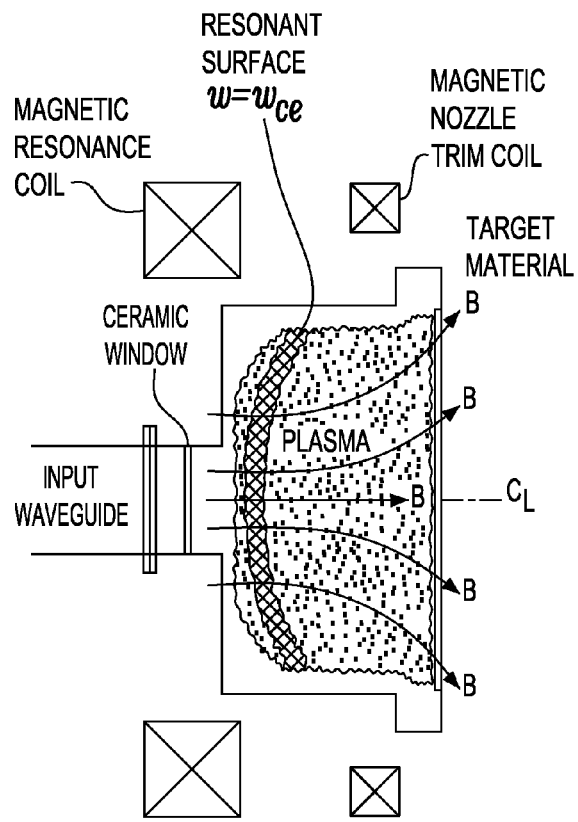
FIG. 18 is a schematic view of electron cyclotron resonance (ECR) plasma device.

Electromagnetic wave coupling of excitation energy to a plasma discharge is also another possible implementation for forming asymmetrical electric field gradients that provide flow vortices to accelerate reactive species towards the work piece 6, i.e., fiber tow. Possible approaches that employ electromagnetic wave coupling include surface wave plasma, microwave plasma, as depicted in FIG. 17, and electron cyclotron resonance (ECR) plasmas, as depicted in FIG. 18. Wave coupling involves the utilization of high energy transmission waves to breakdown the gas into a plasma at appropriate frequencies and pressures (usually low pressure is required). In order to utilize this approach with the disclosed process, wave shape and proximity are parameters that are most sensitive to achieving the desired effect. Additional electromagnetic field manipulation is most likely required in the region between the plasma and the polymeric material in order to deterministically control the plasma sheath thickness, reactive species delivery to the material, and temperature control.

In another aspect, a delivery method is provided for transporting the work piece, e.g., polymeric precursor, into the treatment chamber 100. In one embodiment, the delivery method is provided by a work piece 6, as depicted in FIGS. 1-7 and 9. In one embodiment, the work piece 6 may be provided by a reel-to-reel tow. In one embodiment, a reel-to-reel tow includes a feed reel that is present at the opening at the entrance to the treatment chamber 100 and a take up reel that is present at the opposing opening at the exit of the treatment chamber 100. The term "work piece" as used herein denotes a collection of filaments. In some embodiments, the work piece 6 is composed of long linear lengths of grouped polymeric filaments, and may be referred to as a fiber tow. The work piece 6 may also be provided by mats, in which a fiber mat may include a loosely collected, grouping of polymeric filaments of various lengths, which can be directional, such as unidirectional, or random in orientation. The work piece 6 may also include chopped fiber or may be composed of braided material. For example, a work piece 6 of braided/woven material may include interwoven polymeric filaments creating fabric-like materials. The work piece 6 and the disclosed plasma based process may be used to increase the flame retardancy of pre-oxidized material. In yet another embodiment, the work piece 6 may include cut filaments of various lengths piled together, from several inches down to microns.

Tows are designated by the number of fibers they contain. For example, a 12 k tow contains about 12,000 fibers. Other tow sizes may include 0.5, 1 k, 3 k, 6 k, 24K, 26K, 48K, 50K, 62K and 80 k. The k value indicates the number of individual filaments within the tow by 1000. In some further examples, the work piece 6 may include up to 500,000 filaments, and may be referred to as a band. In the embodiments, in which the work piece 6, e.g., fiber tow, is treated within the treatment chamber 100 with an oxidation process in the production of carbon fiber, the work piece 6 may be composed of a polymer precursor, such as rayon, polyacrylonitrile (PAN) or petroleum pitch. In one example, in which the polymer precursor is composed of polyacrylonitrile (PAN), the precursor formulation may begin with an acrylonitrile monomer, which is combined in a reactor with plasticized acrylic co-monomers, such as methylacrylate or vinyl acetate, and a catalyst, such as itaconic acid, sulfur dioxide acid, sulfuric acid or methylacrylic acid. Continuous stifling blends the ingredients, ensures consistency and purity and initiates the formation of free radicals within the acrylonitrile's molecular structure. This change leads to polymerization, the chemical process that creates long-chain polymers that can be formed into acrylic fibers.

For synthetic polymers, such as rayon or polyacrylonitrile (PAN), the precursor may be first spun into filaments, using chemical and mechanical processes to initially align the polymer atoms in a way to enhance the final physical properties of the completed carbon fiber. Polyacrylonitrile (PAN) fibers may be formed by a process called wet spinning. In one embodiment, a dope immersed in a liquid coagulation bath is extruded through holes in a spinneret made from precious metals. The spinneret holes match the desired filament count of the polyacrylonitrile (PAN) fiber. This wet-spun fiber, relatively gelatinous and fragile is drawn by rollers through a wash to remove excess coagulant, then dried and stretched to continue the orienting of the polyacrylonitrile (PAN) polymer. Here, the filament's external shape and internal cross-section are determined by the degree to which the selected solvent and coagulant have penetrated the precursor fiber, the amount of applied tension and the percentage of filament elongation. An alternative to wet spinning is a hybrid process called dry jet/wet spinning, which uses a vertical air gap between the fiber and coagulate bath. This creates a smooth, round polyacrylonitrile (PAN) fiber that can enhance the fiber/matrix resin interface in composites materials. After drawing or spinning, the polymer fibers may then heated to drive off non-carbon atoms (carbonization). Finishing oil may be applied to the precursor material to prevent the tacky filaments from clumping together. The precursor material may be wound onto bobbins. The bobbin may provide feed reel of the reel to reel apparatus of a fiber tow.

Due to the nature of the integration of the plasma generation system, e.g., electrode assembly 20, into the interior treatment volume 5 of the treatment chamber 100, the position, spread and tension of the work piece 6, e.g., fiber tow, may be selected to ensure that the work piece 6 is close enough to the electrodes 21, 22 of the electrode assembly 20 so that the reactive species produced by the plasma can be accelerated to the work piece 6, e.g., fiber tow. For example, the distance D4 between the work piece 6 and the dielectric barrier 24 of the electrode assembly 20 may be 30 cm or less. In other examples, the distance D4 between the work piece 6 and the dielectric barrier 24 of the electrode assembly 20 is 20 cm, 18 cm, 16 cm, 14 cm, 12 cm, 10 cm, 8 cm, 6 cm, 4 cm, 2 cm or 1 cm. Any range resulting from any two of the foregoing values is also contemplated herein. For example, the distance D4 between the work piece 6, e.g., fiber tow, and the dielectric barrier 24 may range from 1 cm to 15 cm. In another embodiment, the distance D4 between the work piece, e.g., fiber tow 6, and the dielectric barrier 24 may range from 5 cm to 10 cm. Finally, the fiber must be under tension during the course of processing, so that the proper balance between molecular relaxation (due to heat) and molecular orientation (due to tension) can be achieved. The minimum tension required is such that there is no sagging of the work piece 6 along the full length of the chamber. For work pieces 6 composed of a fiber tow, the higher range is mostly dependent on tow size (number of filaments per tow). The tension can range from 10 g to 50 kg, depending on the number of filaments per tow.

In one embodiment, the reel speed is selected so that the portion of the work piece 6 being treated by the reactive species is present within the interior treatment volume 5 of the plasma treatment apparatus for a time period ranging from 1 minute to 300 minutes. In another embodiment, the reel speed is selected so that the portion of the work piece 6 being treated by the reactive species is present within the interior treatment volume 5 of the plasma treatment apparatus for a time period ranging from 20 minutes to 80 minutes. In yet another embodiment, the reel speed is selected so that the portion of the work piece 6 being treated by the reactive species is present within the interior treatment volume 5 of the plasma treatment apparatus for a time period ranging from 1 minute to 60 minutes. In an event further embodiment, the reel speed is selected so that the portion of the work piece 6 being treated by the reactive species is present within the interior treatment volume 5 of the plasma treatment apparatus for a time period ranging from 5 minutes to 10 minutes. The time period for applying the reactive species to the work piece 6 may include any value between the above noted ranges. It is noted that the above described time periods are provided for illustrative purposes only and are not intended to limit the present disclosure.

The work piece 6 that is traversed through the treatment chamber 100 may be a single tow of precursor material, as depicted in FIGS. 1, 2A, 4A, 4B and 5, or may include multiple work pieces 6 of precursor material, as depicted in FIGS. 3A and 7. The work piece 6 may include any number of tows of precursor material and is not limited to only the number depicted in the supplied figures.

The treatment chambers 100 that are depicted in FIGS. 1-7 may be employed for the synthesis of carbon fiber. Specifically, the production of carbon fibers from thermoplastic-based fibers, e.g., polyacrylonitrile (PAN), is typically a multi-step process that may include an oxidation or stabilizing processing step followed by a carbonization step and optionally a graphitization step. The oxidation or stabilizing process step may be provided using the above described treatment chamber 100 and oxygen containing reactive species that is produced by the plasma generated electrode assembly and the process gas. The reactive species is accelerated towards the work piece 6 of polymer precursor, e.g., polyacrylonitrile (PAN), by the flow vortices that result from the asymmetrical electric field gradient produced by the electrode assembly 20, in which the reactive species oxidizes the work piece 6 of the polymer precursor, e.g., polyacrylonitrile (PAN).

Following oxidation, the carbonization step and optionally the graphitization step may be applied to the oxidized work piece 6. Carbonization may occur in an inert (oxygen-free) atmosphere inside a series of furnaces that progressively increase the processing temperature. For example, when the work piece 6 is a fiber tow, during the carbonization step, the oxidized fibers, i.e., oxidized fiber tow, may be carbonized at temperatures starting at about 500° C. and continuing up to about 1200° C. in an inert atmosphere. During graphitization the furnace temperatures may reach up to about 3000° C.

At the entrance and exit of each furnace, purge chambers may be present to prevent oxygen intrusion. In the absence of oxygen, only non-carbon molecules, including hydrogen and cyanide elements and other VOCs (generated during stabilization) and particulate (such as local buildup of fiber debris) are removed and exhausted from the furnaces.

Crystallization of the carbon molecules of the oxidized fiber tow can be optimized to produce a finished fiber that is more than 90 percent carbon. Although the terms "carbon" and "graphite" are often used interchangeably, the term "carbon" denotes fibers carbonized at about 1000° C. to 1200° C., e.g., 1350° C., that contain from 93% to 95% carbon. The term "graphite" denotes carbon fibers that have been graphitized at temperatures ranging from 1900° C. to 3000° C., e.g., 2480° C., which contain more than 99 percent elemental carbon. In some embodiments, carbon heated in the range of 1500-2000° C. (carbonization) exhibits the highest tensile strength, while carbon fiber heated from 2300 to 3000° C. (graphitizing) exhibits a higher modulus of elasticity.

Applications of the material resulting from plasma treatment with the methods and structures disclosed herein include structural applications, such as carbon fiber. The material processed using the methods and structures disclosed herein may also be applicable for thermal applications, such as flame retardant material. For example, oxidized PAN is a well known flame retardant material. The methods and structures disclosed herein may also by applicable to material processing applications, such as thermosetting. In some examples, the methods disclosed herein may be repeated to increase the density of the work piece being treated by the close proximity indirect exposure (CPIE) plasma device.

The following examples are provided to further illustrate the methods and structures of the present disclosure and demonstrate some advantages that arise therefrom. It is not intended that the present disclosure be limited to the specific examples described herein.

EXAMPLES

Quality of polyacrylonitrile (PAN) precursor: Table 1 lists the results from the oxidation of aerospace grade polyacrylonitrile (PAN) precursor using both remote exposure (RE) oxidation plasma methods and close proximity indirect exposure (CPIE) plasma methods. The close proximity indirect exposure (CPIE) method has been described above with reference to the treatment chamber 100 that is depicted in FIGS. 1-7. The residence time is the amount of time that was spent processing the precursor, i.e., fiber tow 6. The quality number is a qualitative rating of the amount of damage sustained by the work piece after processing, with a range of 1-10, 10 being damage-free. A 10 represents a fiber with absolutely no detectable defects via optical microscopy at 400-500×. The DD rating is defined as the normalized multiplier of quality and density. The optimal density for aerospace grade carbon fiber in structural applications typically is 1.375 g/cc. The quality scale used below is from 1-10, with a 10 exhibiting no damage. Therefore, a perfectly process carbon fiber having a quality of 10 and a density of 1.375 g/cc would have a DD rating of 1.0.

TABLE 1

Comparison of Select Data between Remote Exposure (RE) and Close Proximity indirect exposure (CPIE).

| Test | Max Tension (N) | Max Temp (° C.) | Power (W) | Length (ft) | Speed (inch/min) | Dwell Time (min) | Flow (lpm) |
|---|---|---|---|---|---|---|---|
| SR414 | 0.3 | 240 | 950 | 3 | 1 | 77 | 49.2 |
| SR414-SMR2 | 0.3 | 230 | 150 | 3 | 0.8 | 77.5 | 0 |
| SR415 | 0.3 | 230 | 950 | 3 | 1 | 77 | 60 |
| SR415-SMR2 | 0.3 | 230 | 150 | 3 | 0.8 | 77.5 | 10 |
| SR417 | 0.3 | 240 | 950 | 3 | 1 | 77 | 60 |
| SR417-SMR2 | 0.3 | 247 | 150 | 3 | 0.8 | 77.5 | 20 |

The data included in Table 1 shows that the close proximity indirect exposure (CPIE) oxidation plasma method produced higher densities and higher quality fiber given the same amount of processing time than comparative remote exposure (RE) oxidation methods.

Mechanical properties polyacrylonitrile (PAN) precursor oxidized and carbonized using remote exposure (RE) and close proximity indirect exposure (CPIE) method: Tables 2 and 3 show the mechanical properties of oxidized and carbonized polyacrylonitrile (PAN) precursor. Table 2 includes results from the remote exposure (RE) method for the oxidation step with a typical residence time of 77 minutes. The oxidized carbon fiber was then characterized for fiber diameter, peak stress, modulus and % strain at breaking. The results were recorded in Table 2. The oxidized carbon fibers were then carbonized and characterized again for fiber diameter, peak stress, modulus and the % strain at breaking. The results of the characterization for carbonized fibers produced using the remote exposure (RE) methods were recorded in Table 2.

TABLE 2

Mechanical properties of carbon fiber processed using the Remote Exposure method.

| Precursor sample | OXIDIZED | | | | CARBONIZED | | | |
|---|---|---|---|---|---|---|---|---|
| | Fiber Diameter (microns) | Peak stress (ksi) | Modulus (Msi) | Strain @ break (%) | Fiber Diameter (microns) | Peak stress (ksi) | Modulus (Msi) | Strain @ break (%) |
| SR409 | 12.5 | 50.3 | 0.8 | 17 | | | | |
| SR410 | 11.8 | 16.2 | 0.8 | 2.6 | 7.13 | 121.7 | 23.5 | 0.49 |
| SR411 | 11.9 | 14.7 | 0.8 | 1.9 | 6.9 | 117.7 | 22 | 0.48 |
| SR413 | 11.2 | 19.1 | 0.8 | 2.8 | 7.61 | 110.7 | 20 | 0.55 |
| SR414 | 12.7 | 34.4 | 0.8 | 8.1 | 8.32 | 130.1 | 20.8 | 0.58 |
| SR415 | 12.8 | 27.9 | 0.6 | 8.3 | 6.93 | 142.5 | 24.5 | 0.59 |
| SR417 | 12.5 | 21 | 0.8 | 3.2 | | | | |

Table 3 shows results from the close proximity indirect exposure (CPIE) method for the oxidation step having a residence time ranging from 20 minutes to 45 minutes. Following oxidation, the fiber tow 6 was characterized for a fiber diameter, peak stress, modulus and the % strain at breaking. Thereafter, the oxidized fiber tow 6 was carbonized, and characterized again. The results of the characterization for the close proximity indirect exposure (CPIE) method were recorded in Table 3.

TABLE 3

TABLE showing mechanical properties of carbon fiber processed using the Close-proximity indirect exposure method.

| Precursor sample | OXIDIZED | | | | CARBONIZED | | | |
|---|---|---|---|---|---|---|---|---|
| | Fiber Diameter (microns) | Peak stress (ksi) | Modulus (Msi) | Strain @ break (%) | Fiber Diameter (microns) | Peak stress (ksi) | Modulus (Msi) | Strain @ break (%) |
| 12 | 11.9 | 49.2 | 1.64 | 15.6 | 7.12 | 436.2 | 30.5 | 1.3 |
| 12 | | | | | 7.15 | 372.3 | 30 | 1.14 |
| 13 | 11.6 | 46.1 | 1.5 | 13.8 | 7.38 | 265 | 31.6 | 0.8 |
| 13 | | | | | 7.2 | 314.8 | 34.7 | 0.88 |
| 14 | 11.3 | 47.3 | 1.46 | 14.2 | 7.38 | 350.05 | 31 | 1.05 |
| 14 | | | | | 6.96 | 335.6 | 34.8 | 0.93 |
| 15 | 11.3 | 48.3 | 1.46 | 13.2 | 7.11 | 418.9 | 31.4 | 1.25 |
| 15 | | | | | 7.29 | 385.8 | 31.6 | 1.15 |
| 16 | 10.7 | 50.3 | 1.55 | 9.9 | 6.83 | 354.3 | 33.3 | 1 |
| 16 | | | | | 6.51 | 415.8 | 34.8 | 1.11 |
| 17 | 9.6 | 54.5 | 1.79 | 10.2 | 6.56 | 331.3 | 32.8 | 0.95 |
| 17 | | | | | 6.11 | 416.6 | 36.3 | 1.06 |
| 18 | 11.2 | 46.9 | 1.39 | 13.2 | 7.26 | 334.8 | 30.9 | 1.02 |
| 18 | | | | | 7.07 | 358.3 | 32.3 | 1.05 |
| 19 | 11.5 | 55.9 | 1.51 | 13.8 | | | | |
| 20 | 11.6 | 60.4 | 1.44 | 15.4 | 6.85 | 379.6 | 29.4 | 1.2 |

Comparison of the data included in Tables 2 and 3 indicates that the close proximity indirect exposure (CPIE) plasma treatment method provided an improvement in the overall mechanical properties of the processed carbon fiber, while simultaneously dramatically reducing the time required for oxidation, when compared to remove exposure plasma treatment method.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for plasma stabilization and oxidation of a polymeric workpiece, the method comprising:
    providing a treatment chamber including an intermediate heating volume and an interior treatment volume, wherein the interior treatment volume contains an electrode assembly for generating a plasma and the intermediate heating volume heats the interior treatment volume; traversing said polymeric workpiece through the interior treatment volume, provided that said polymeric workpiece is in an indirect close proximity of 1 to 30 cm from said electrode assembly, and said polymeric workpiece is comprised of a polymeric material; introducing an oxygen-containing process gas to the interior treatment volume of the treatment chamber; and
    forming the plasma with the electrode assembly from the oxygen-containing process gas in said interior treatment volume, wherein a reactive species of the plasma is accelerated towards the polymeric workpiece by flow vortices produced in the interior treatment volume, wherein said flow vortices result from an asymmetrical electric field gradient produced by an asymmetrical electrode geometry, and wherein said plasma stabilization and oxidation results in at least oxidation and crosslinking of the polymeric workpiece through the interior region of the polymeric workpiece.

2. The method of claim 1, wherein the intermediate heating volume increases a. temperature of the interior treatment volume up to 500° C.

3. The method of claim 1, wherein the electrode assembly comprises at least one first electrode on a first side of a dielectric surface and at least one second electrode on an opposing second dielectric surface.

4. The method of claim 1, wherein the polymeric workpiece comprises a fiber tow.

5. The method of claim 1, wherein a treated portion of the polymeric workpiece is present in the interior treatment volume for a time period ranging from 1 minute to 300 minutes.

6. The method of claim 1, wherein the oxygen-containing process gas that is introduced to the interior treatment volume comprises a gas selected from the group consisting of air, oxygen, nitrogen oxides, carbon dioxide, carbon monoxide, oxygen-containing gas, and combinations thereof.

7. The method of claim 1, wherein the process gas is a gas mixture of nitrogen ($N_2$) and diatomic molecular oxygen ($O_2$), wherein, the diatomic molecular oxygen ($O_2$) content may range from 10% to 100% and the nitrogen ($N_2$) content may range from 0% to 95%.

8. The method of claim 1, wherein the forming of the plasma comprises applying an alternating current (AC) to the electrode assembly in a frequency range of 30 Hz to 20 MHz.

9. The method of claim 1, wherein the reactive species of the plasma is selected from the group consisting of $O_2$, $O_x$,O, $N_xO_y$,$H_xO_y$, and ions, radicals, excited states and metabolic stables of the process gas.

10. The method of claim 1, wherein the polymeric workpiece is comprised of polyacrylonitrile (PAN) and the reactive species is comprised of an oxygen containing species, wherein the reactive species oxidizes the polymeric workpiece.

11. The method of claim 1, wherein the electrode assembly for generating the plasma includes a plurality of plasma forming electrode assemblies, which can be independently energized to provide a temperature gradient along a length of the interior treatment volume.

12. The method of claim 1, wherein said polymeric workpiece is in a close proximity of 1 to 20 cm from said electrode assembly.

13. The method of claim 1, wherein said polymeric workpiece is in a close proximity of 1 to 15 cm from said electrode assembly.

14. The method of claim 1, wherein said intermediate heating volume is an exterior heating volume that surrounds said interior treatment volume, wherein the exterior heating volume is defined by an outer shell and an inner shell and heats the interior treatment volume, wherein the inner shell separates the exterior heating volume from the interior treatment volume and defines the volume and shape of the interior treatment volume.

15. The method of claim 1, wherein said polymeric material is selected from the group consisting of rayon, polyacrylonitrile (PAN), petroleum, coal-based pitch, lignin, and combinations thereof.

16. The method of claim 1, wherein said plasma is operated at a pressure of 1 torr to 1500 torr.

17. The method of claim 1, wherein said plasma is operated at a pressure of 250 torr to 800 torr.

18. The method of claim 1, wherein said plasma is operated at a pressure of approximately 760 torr.

* * * * *